(12) United States Patent
Cho et al.

(10) Patent No.: US 11,502,061 B2
(45) Date of Patent: Nov. 15, 2022

(54) SEMICONDUCTOR PACKAGE

(71) Applicant: SAMSUNG ELECTRONICS CO., LTD., Suwon-si (KR)

(72) Inventors: Youngsang Cho, Suwon-si (KR); Heeseok Lee, Suwon-si (KR); Yunhyeok Im, Suwon-si (KR); Moonseob Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 508 days.

(21) Appl. No.: 16/592,897

(22) Filed: Oct. 4, 2019

(65) Prior Publication Data

US 2020/0328187 A1 Oct. 15, 2020

(30) Foreign Application Priority Data

Apr. 15, 2019 (KR) .................. 10-2019-0043784

(51) Int. Cl.
| | | |
|---|---|---|
| *H01L 25/065* | (2006.01) | |
| *H01L 23/538* | (2006.01) | |
| *H01L 23/498* | (2006.01) | |
| *H01L 23/31* | (2006.01) | |

(52) U.S. Cl.
CPC ...... *H01L 25/0657* (2013.01); *H01L 23/3128* (2013.01); *H01L 23/3135* (2013.01); *H01L 23/49811* (2013.01); *H01L 23/5385* (2013.01); H01L 2225/06572 (2013.01)

(58) Field of Classification Search
CPC .......... H01L 23/3135; H01L 23/49811; H01L 23/5385; H01L 2225/06572; H01L 25/0657

See application file for complete search history.

(56) References Cited

U.S. PATENT DOCUMENTS

| | | | |
|---|---|---|---|
| 6,977,348 | B2 | 12/2005 | Ho et al. |
| 7,176,561 | B2 | 2/2007 | Aoyagi |
| 8,008,764 | B2 | 8/2011 | Joseph et al. |
| 8,704,364 | B2 | 4/2014 | Banijamali |
| 9,780,042 | B2 | 10/2017 | Woychik et al. |
| 2005/0266701 | A1 | 12/2005 | Aoyagi |
| 2009/0121344 | A1 | 5/2009 | Sunohara |
| 2013/0168871 | A1* | 7/2013 | Kim ..................... H01L 25/105 257/774 |
| 2017/0141092 | A1* | 5/2017 | Kim .................. H01L 25/0652 |
| 2017/0358552 | A1 | 12/2017 | Breiner et al. |

FOREIGN PATENT DOCUMENTS

| | | |
|---|---|---|
| JP | 3972209 B2 | 6/2007 |
| JP | 2010-025822 A | 2/2010 |
| JP | 2014-222728 A | 11/2014 |
| KR | 10-0990173 B1 | 10/2010 |

* cited by examiner

*Primary Examiner* — Jasmine J Clark
(74) *Attorney, Agent, or Firm* — Lee IP Law, P.C.

(57) ABSTRACT

A semiconductor package includes a package substrate, a lower semiconductor chip on the package substrate, an interposer on the lower semiconductor chip, the interposer including a plurality of pieces spaced apart from each other, an upper semiconductor chip on the interposer, and a molding member covering the lower semiconductor chip and the interposer.

20 Claims, 30 Drawing Sheets

SEMICONDUCTOR PACKAGE

CROSS-REFERENCE TO RELATED APPLICATION

Korean Patent Application No. 10-2019-0043784, filed on Apr. 15, 2019, in the Korean Intellectual Property Office, and entitled: "Semiconductor Package," is incorporated by reference herein in its entirety.

BACKGROUND

1. Field

Embodiments relate to a semiconductor package, and more particularly, to a semiconductor package including an interposer.

2. Description of the Related Art

Recently, demand for portable devices has been rapidly increasing in the electronic products market. Thus, there is a continuing demand for miniaturization and reduced weight of electronic components in the electronic products.

A semiconductor package including such electronic components is required to process a large amount of data while decreasing the volume thereof. Thus, there is also a demand for highly integrated and single-packaged semiconductor chips mounted on such a semiconductor package. Accordingly, an interposer has been used to efficiently arrange the semiconductor chips in a limited structure of the semiconductor package.

SUMMARY

According to an aspect of embodiments, there is provided a semiconductor package including a package substrate, a lower semiconductor chip disposed on the package substrate, an interposer disposed on the lower semiconductor chip and including a plurality of pieces spaced apart from each other, an upper semiconductor chip disposed on the interposer and a molding member covering the lower semiconductor chip and the interposer.

According to an aspect of embodiments, there is provided a semiconductor package including a package substrate, a lower semiconductor chip disposed on the package substrate, an interposer disposed on the lower semiconductor chip and partitioned into a plurality of regions through a groove formed in an upper surface thereof, an upper semiconductor chip disposed on the interposer, a bonding wire connecting the package substrate to the interposer, and a molding member covering the lower semiconductor chip, the interposer and the bonding wire, wherein a thermal expansion coefficient of the molding member is greater than a thermal expansion coefficient of the interposer.

According to an aspect of embodiments, there is provided a semiconductor package including a package substrate, a lower semiconductor chip disposed on the package substrate, an interposer disposed on the lower semiconductor chip and partitioned into a plurality of regions through a groove formed in a side surface thereof, an upper semiconductor chip disposed on the interposer, a bonding wire connecting the package substrate to the interposer, and a molding member covering the lower semiconductor chip, the interposer and the bonding wire, wherein a thermal expansion coefficient of the molding member is greater than a thermal expansion coefficient of the interposer.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, example embodiments will be described in detail with reference to the accompanying drawings.

Figure 1A:
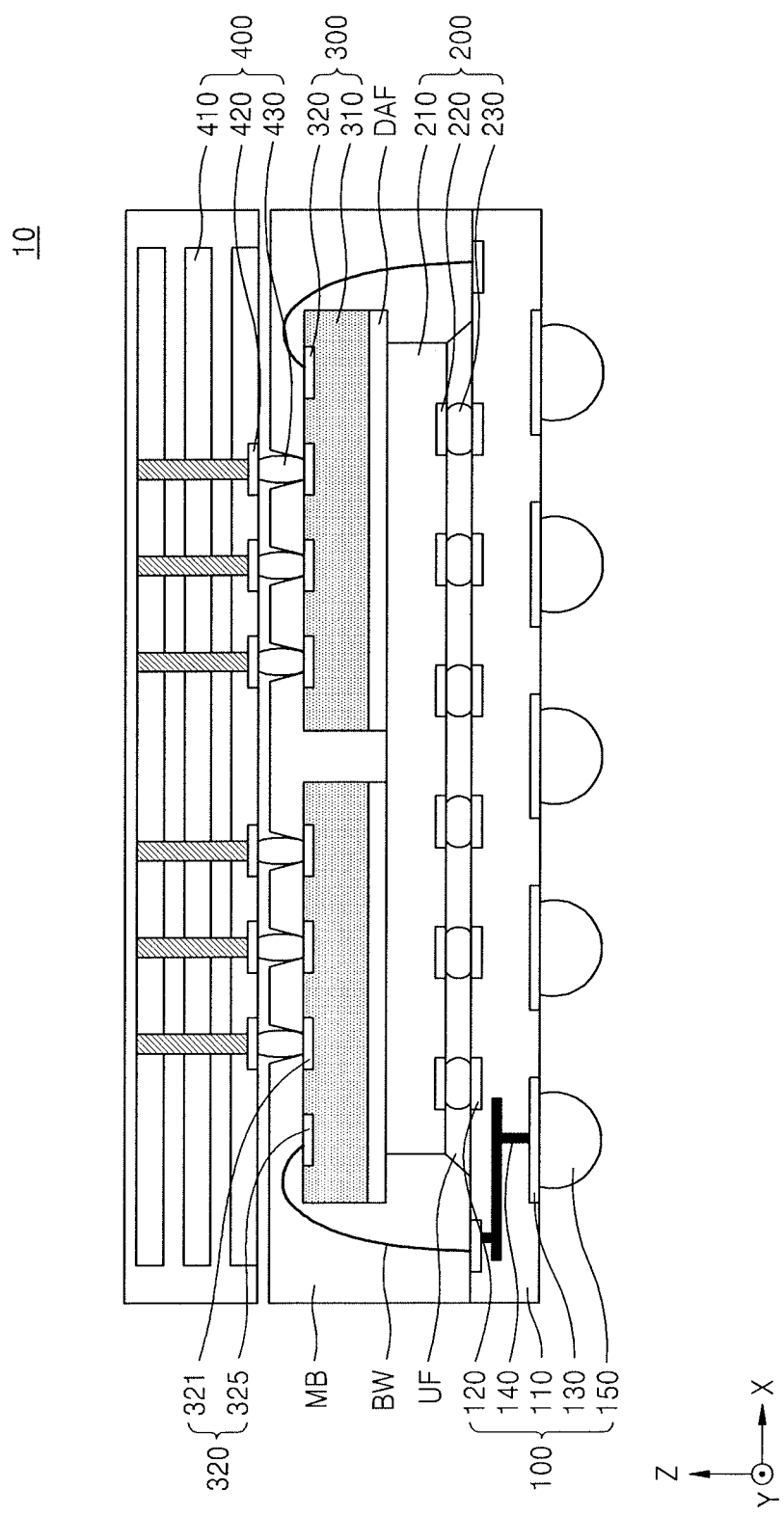
FIGS. 1A to 1D illustrate diagrams of a semiconductor package according to an example embodiment.
Figure 1B:
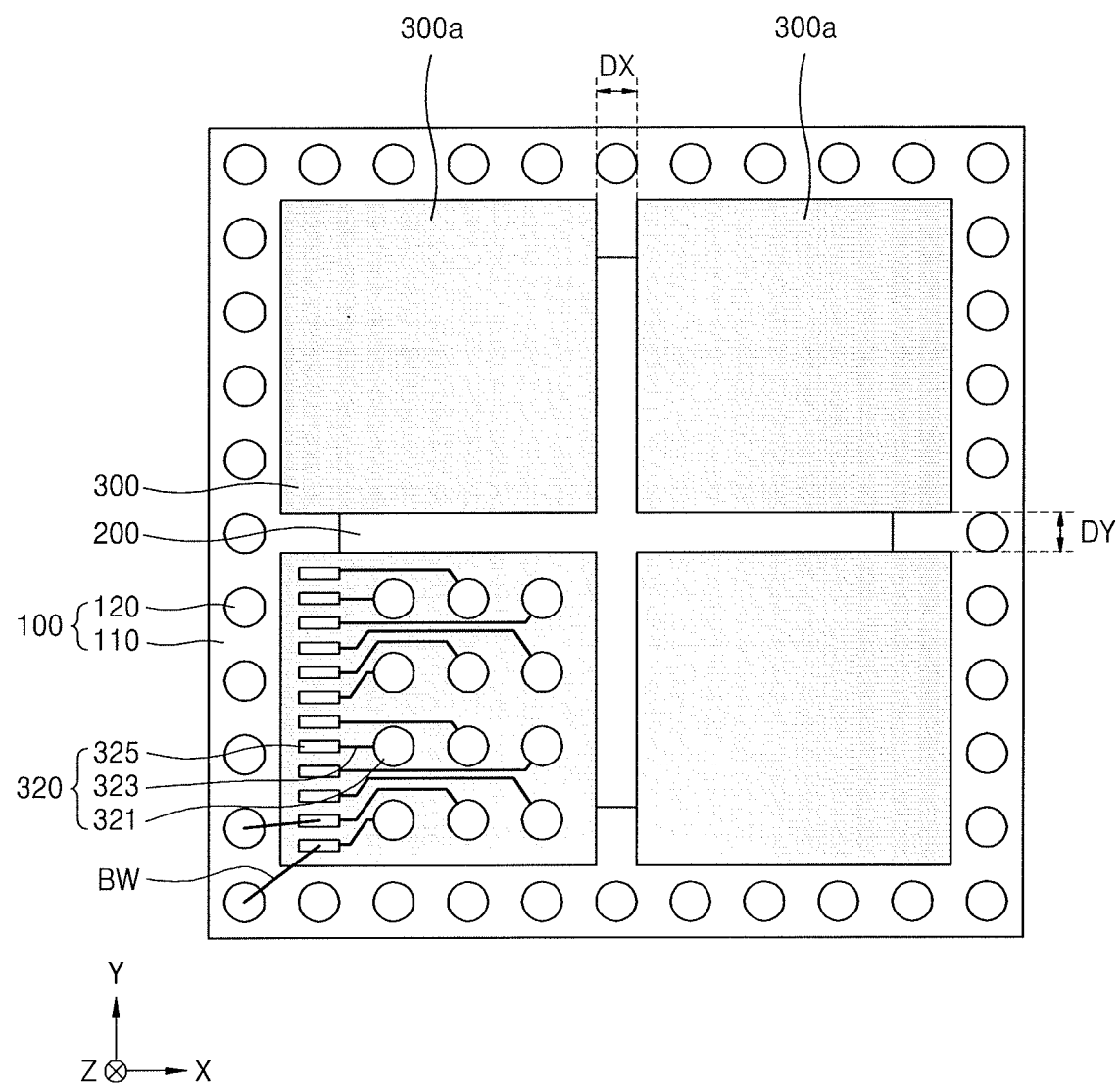
Figure 1C:
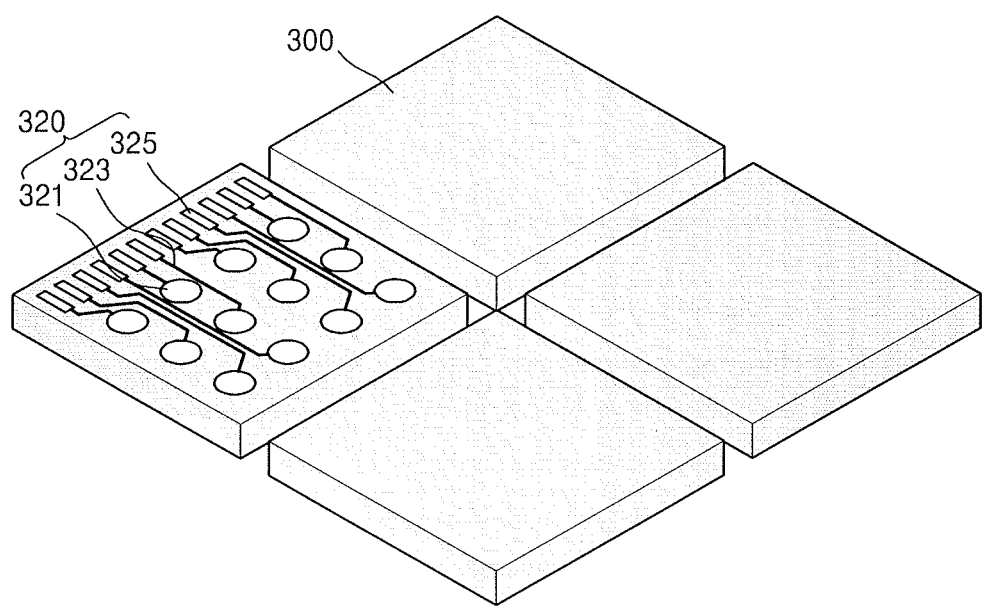
Figure 1D:
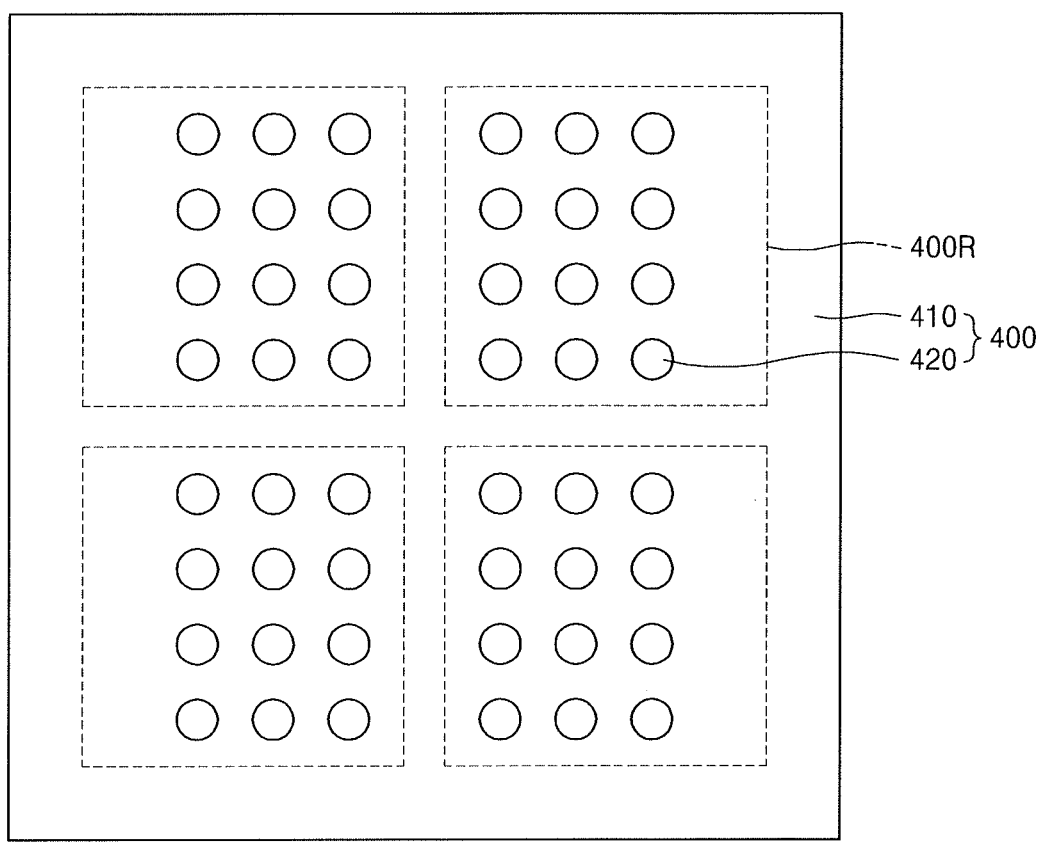

FIGS. 1A to 1D are diagrams illustrating a semiconductor package according to an example embodiment. Specifically, FIG. 1A is a cross-sectional view of a semiconductor package 10, FIG. 1B is a plan view of the semiconductor package 10, FIG. 1C is a perspective view of an interposer 300 in the semiconductor package 10, and FIG. 1D is a bottom view of an upper semiconductor chip 400 in the semiconductor package 10.

For convenience of explanation, a molding member MB and the upper semiconductor chip 400 are omitted in FIG. 1B to illustrate a top view of the interposer 300 on a lower semiconductor chip 200. Further, a redistribution layer structure 320 is illustrated on a single piece of the interposer 300 in FIGS. 1B and 1C only for convenience, and the redistribution layer structure 320 may be formed on each piece of the interposer 300 (e.g., FIG. 1A). Furthermore, the cross-section of FIG. 1A reflects a cross-section through elements 321 and 325 in two adjacent pieces of the interposer 300, and element 323 connecting elements 321 and 325 is omitted from FIG. 1A, for convenience.

Referring to FIGS. 1A to 1D, the semiconductor package 10 may include a package substrate 100, a lower semiconductor chip 200 on the package substrate 100, an interposer 300 on the lower semiconductor chip 200, and an upper semiconductor chip 400 on the interposer 300. The interposer 300 may include a plurality of pieces, i.e., a plurality of portions spaced apart from each other (e.g., FIG. 1C), as will be described in more detail below.

In detail, the package substrate 100 may be a support substrate. For example, the package substrate 100 may include a body portion 110, a lower protective layer, and an upper protective layer. The package substrate 100 may be formed based on a printed circuit board (PCB), a wafer substrate, a ceramic substrate, a glass substrate, or the like. For example, in the semiconductor package 10, the package substrate 100 may be a PCB.

A wiring 140 may be formed in the package substrate 100. The wiring 140 may be electrically connected to the lower semiconductor chip 200 through at least one of, e.g., a pillar structure, a solder bump, a solder ball, and a solder layer, which are connected to an upper electrode pad 120 formed in an upper surface of the package substrate 100.

Further, an external connection terminal 150 may be disposed on a lower electrode pad 130 formed in a lower surface of the package substrate 100. The package substrate 100 may be electrically connected to a module substrate or a system board of an electronic product through the external connection terminal 150.

For example, a multilayer or a single layer of the wiring 140 may be formed in the body portion 110, and the external connection terminal 150 may be electrically connected to the lower semiconductor chip 200 through the wiring 140. The lower protective layer and the upper protective layer may protect the body portion 110 and may include, e.g., a solder resist.

When the package substrate 100 is a PCB, the body portion 110 may include a thermosetting polymer. For example, the body portion 110 may be implemented by compressing a polymer material, e.g., a thermosetting resin, an epoxy resin, e.g., flame retardant 4 (FR-4), bismaleimide triazine (BT), Ajinomoto build up film (ABF), or a phenolic resin to a predetermined thickness to be thin, applying copper foil to both sides thereof, and forming the wiring 140 through a patterning process, which is a path for transmission of an electrical signal. A solder resist may be coated all over a lower surface and an upper surface of the body portion 110, except for the upper electrode pad 120 and the lower electrode pad 130, to form the lower protective layer and the upper protective layer. A thermal expansion coefficient of the package substrate 100 may be relatively large compared to a thermal expansion coefficient of a comparative semiconductor substrate due to the characteristics of the materials constituting the package substrate 100, e.g., due to the thermosetting polymers used in the body portion 110 of the package substrate 100.

In general, a PCB may be classified into a single layer PCB having the wiring 140 formed on only one side thereof and a double layer PCB having the wiring 140 formed on both sides thereof. For example, the number of layers of copper foil may be three or more by using an insulator, e.g., prepreg, and a PCB having a multilayer structure may be implemented by forming three or more wirings 140 according to the number of layers of copper foil to be formed. However, the package substrate 100 is not limited to the structure and material of the above-described printed circuit board.

The lower semiconductor chip 200 may be implemented as a single logic chip, e.g., a microprocessor, a graphics processor, a signal processor, a network processor, a chipset, an audio codec, a video codec, an application processor, a system on chip, and the like. However, the lower semiconductor chip 200 is not limited thereto.

In addition, the lower semiconductor chip 200 may include a semiconductor substrate 210 and a chip pad 220 formed in the lower surface of the semiconductor substrate 210. The chip pad 220 may be connected to a logic device of the lower semiconductor chip 200 through a wiring structure.

The semiconductor substrate 210 constituting the lower semiconductor chip 200 may have an active surface and an inactive surface opposite to the active surface. The active surface of the semiconductor substrate 210 may be a surface facing an upper surface of the package substrate 100. A plurality of active devices and/or passive devices may be formed on the active surface of the semiconductor substrate 210. Further, the chip pad 220 may be formed on the active surface of the semiconductor substrate 210.

The chip pad 220 may be directly connected to the upper electrode pad 120 disposed in the upper surface of the package substrate 100 through a connection terminal 230. The chip pad 220 and the upper electrode pad 120 may be used as terminals for signal transmission between the lower semiconductor chip 200 and the package substrate 100. The numbers of chip pads 220 and upper electrode pads 120 and the arrangement thereof are illustratively shown, and are not limited thereto.

The connection terminal 230 may be disposed on the chip pad 220. The connection terminal 230 may electrically connect the lower semiconductor chip 200 to the package substrate 100. Through the connection terminal 230, at least one of a control signal, a power supply signal, and a ground signal for operation of the lower semiconductor chip 200 may be provided from outside, a data signal to be stored in the lower semiconductor chip 200 may be provided from the outside, or a data stored in the lower semiconductor chip 200 may be provided to the outside. For example, the connection terminal 230 may be a flip-chip connection, e.g., the connection terminal 230 may include at least one of a pillar structure, a solder bump, a solder ball, and a solder layer.

For example, the semiconductor substrate 210 may include a silicon wafer including silicon (Si), e.g., crystalline silicon, polycrystalline silicon, or amorphous silicon. In another example, the semiconductor substrate 210 may include a semiconductor element, e.g., germanium, or a compound semiconductor, e.g., silicon carbide (SiC), gallium arsenide (GaAs), indium arsenide (InAs), and indium phosphide (InP). In the semiconductor package 10 according to embodiments, the semiconductor substrate 210 may be a silicon wafer. The silicon wafer may have a thermal expansion coefficient of about 7.6 ppm/K, which may be relatively small compared to the thermal expansion coefficient of the package substrate 100.

The semiconductor substrate 210 may have a silicon on insulator (SOI) structure. For example, the semiconductor substrate 210 may include a buried oxide (BOX) layer. The semiconductor substrate 210 may include a conductive region, e.g., a well doped with impurities, or a structure doped with impurities. In addition, the semiconductor substrate 210 may have various device isolation structures, e.g., a shallow trench isolation (STI) structure and the like.

The interposer 300 may be positioned between the lower and upper semiconductor chips 200 and 400, e.g., the interposer 300 may be positioned on the inactive surface of the semiconductor substrate 210 of the lower semiconductor chip 200. The interposer 300 may include a base substrate 310 and a redistribution layer structure 320 formed in the base substrate 310. For example, as illustrated in FIG. 1A, the redistribution layer structure 320 may be formed in an upper surface of the base substrate 310 to have upper surfaces level with the upper surface of the base substrate 310.

The base substrate 310 may include a silicon wafer including silicon (Si), e.g., crystalline silicon, polycrystalline silicon, or amorphous silicon. That is, the base substrate 310 and the semiconductor substrate 210 may both include silicon wafers, and thus, the thermal expansion coefficient of the base substrate 310 is relatively less than the thermal expansion coefficient of the package substrate 100.

Referring to FIGS. 1A and 1B, the redistribution layer structure 320 may include an upper surface pad 321 electrically connected to the upper semiconductor chip 400, a bonding pad 325 electrically connected to a bonding wire BW, and a redistribution layer 323 electrically connecting the upper surface pad 321 to the bonding pad 325. For example, as illustrated in FIG. 1B, the redistribution layer structure 320 may include a plurality of upper surface pads 321, a plurality of bonding pads 325, and a plurality of redistribution layers 323 electrically connecting each upper surface pad 321 to a respective bonding pad 325. Here, the upper surface pad 321 may be formed to be exposed from a molding member MB, e.g., a portion of the molding member MB may be removed to expose an upper surface of the upper surface pad 321. Although the redistribution layer structure 320 is illustrated as being formed only on a single piece of the interposer 300 in FIGS. 1B and 1C, it is for the sake of explanation, and the redistribution layer structure 320 may also formed in other pieces of the interposer 300, e.g., two adjacent pieces illustrated in FIG. 1A or all pieces of the interposer 300.

For example, the interposer 300 may further include a circuit region. For example, a buffer circuit capable of controlling capacitance loading of the upper semiconductor chip 400 may be formed in the circuit region of the interposer 300. In some embodiments, the circuit region may include a semiconductor integrated circuit including at least one of, e.g., a transistor, a diode, a capacitor, and a resistor. In another example, the circuit region may be omitted.

In some embodiments, the interposer 300 may be disposed in an area between the lower semiconductor chip 200 and the upper semiconductor chip 400 so as to overlap with the lower semiconductor chip 200 and the upper semiconductor chip 400, respectively (FIG. 1A). For example, in a plan view, a portion of the interposer 300 may overlap with the lower semiconductor chip 200 and an entire portion of the interposer 300 may overlap with the upper semiconductor chip 400 (FIG. 1A). For example, in a plan view, an outermost edge of the interposer 300 may extend beyond an edge of the lower semiconductor chip 200 (FIG. 1B), and an edge of the upper semiconductor chip 400 may extend beyond the outermost edge of the interposer 300 (FIG. 1A).

As illustrated in FIGS. 1B and 1C, according to embodiments, the interposer 300 may include a plurality of pieces 300a. For example, as illustrated in FIG. 1B, the interposer 300 may include a plurality of discrete portions spaced apart from each other along the X direction and the Y direction, e.g., in a matrix pattern. For example, the interposer 300 may include 2N pieces (N is a natural number), and the 2N pieces, i.e., portions, may be disposed on the lower semiconductor chip 200 with spaces therebetween in a bilateral symmetrical structure, in a plan view. Accordingly, a portion of an upper surface of the lower semiconductor chip 200 corresponding to an empty space formed between adjacent 2N pieces, e.g., portions, that are spaced apart from each other may not overlap with the interposer 300, i.e., the lower semiconductor chip 200 may overlap the empty space between portions 300a of the interposer 300 (FIG. 1B).

In detail, pieces 300a, i.e., portions 300a (pieces 300a and portions 300a may be used interchangeable hereinafter), of the interposer 300 may be spaced apart from each other by a first distance DX in a first direction, i.e., in the X direction, and by a second distance DY in a second direction, i.e., in the Y direction. Each of the pieces 300a, i.e., portions 300a, may be configured to have the same or different shapes and the same or different dimensions, e.g., areas in the XY plane and thicknesses in the Z direction. The first distance DX and the second distance DY may also be configured to have the same or different lengths.

In the semiconductor package 10 according to embodiments, since the interposer 300 may include the plurality of pieces 300a, i.e., portions 300a, a space between the plurality of pieces 300a, i.e., portions 300a, may be filled with the molding member MB. For example, referring to FIGS. 1A-1C, the interposer 300 may include the pieces 300a arranged along rows and columns in the X and Y directions, e.g., in a matrix pattern, on the lower semiconductor chip 200, with portions of the molding member MB, e.g., completely, filling spaces between adjacent pieces 300a in the X and Y directions. As such, the pieces 300a of the interposer 300 with portions of the molding member MB therebetween provide an interposer constituted of different materials having different expansion coefficients. As will be described in more detail later, the thermal expansion coefficient of the interposer 300 may be different from, e.g., lower than, the thermal expansion coefficient of the molding member MB.

The upper semiconductor chip 400 may be positioned on the interposer 300 and include, e.g., a volatile memory chip and/or a non-volatile memory chip. In another example, the upper semiconductor chip 400 may include a high bandwidth memory chip. The volatile memory chip may include, e.g., dynamic random-access memory (DRAM), static RAM (SRAM), thyristor RAM (TRAM), zero capacitor RAM (ZRAM), or the like. The non-volatile memory chip may include, e.g., a flash memory, magnetic RAM (MRAM), spin-transfer torque MRAM (STT-MRAM), ferroelectric RAM (FRAM), phase change RAM (PRAM), resistive RAM (RRAM), or the like.

In some embodiments, the upper semiconductor chip 400 may include a stack of a plurality of memory chips capable of merging data with one another. In this case, each memory chip slice constituting the upper semiconductor chip 400 may include a semiconductor substrate having an active surface and an inactive surface opposite to each other, a memory device formed on the active surface, and a through silicon via (TSV). In a system in package, in which a plurality of memory chips are integrated into one package, the number of memory chip slices constituting the upper semiconductor chip 400 may be different depending on the use of the semiconductor package 10. That is, the number of memory chip slices constituting the upper semiconductor chip 400 is not limited to a specific number.

The upper semiconductor chip 400 may include a semiconductor substrate stack 410 and a chip pad 420 formed in a lowermost surface of the semiconductor substrate stack 410. The chip pad 420 may be connected to a memory device of the upper semiconductor chip 400 through a wiring structure.

The chip pad 420 may be directly connected to the upper surface pad 321 disposed in the upper surface of the interposer 300 through a connection terminal 430. The chip pad 420 and the upper surface pad 321 may be used as terminals for signal transmission between the upper semiconductor chip 400 and the interposer 300. The numbers of chip pads 420 and upper surface pads 321 and the arrangement thereof are illustratively shown and are not limited thereto.

The connection terminal 430 may be disposed on the chip pad 420. Due to a height of the connection terminal 430, the upper semiconductor chip 400 may be spaced apart from the molding member MB. The connection terminal 430 may electrically connect the upper semiconductor chip 400 to the interposer 300. Through the connection terminal 430, at least one of a control signal, a power supply signal, and a ground signal for operation of the upper semiconductor chip 400 may be provided from the outside, a data signal to be stored in the upper semiconductor chip 400 may be provided from the outside, or a data stored in the upper semiconductor chip 400 may be provided to the outside.

In addition, the number of terminal regions 400R (FIG. 1D), in which the chip pads 420 are arranged in a group on a lower surface of the upper semiconductor chip 400, i.e., a surface facing the interposer 300, is equal to the number of pieces, i.e., portions, of the interposer 300. The terminal regions 400R may be configured to correspond to, e.g., overlap, an area where the pieces of the interposer 300 are disposed, e.g., each terminal regions 400R and a corresponding portion of the interposer 300 have same sizes and shapes to completely overlap each other. That is, in a manufacturing process of the upper semiconductor chip 400, the chip pad 420 may be designed considering the redistribution layer structure 320 of the interposer 300.

An adhesive member DAF may be disposed to adhere to the lower semiconductor chip 200 and the interposer 300. The adhesive member DAF may include a die attach film. The die attach film may be classified into an inorganic adhesive and a polymer adhesive. Polymer may be generally classified into thermosetting resin and thermoplastic resin, and polymer of hybrid type may be made by mixing these two components.

The bonding wire BW may electrically connect the package substrate 100 to the interposer 300, e.g., via the bonding pad 325. The bonding wire BW may include at least one of, e.g., gold (Au), silver (Ag), copper (Cu), and aluminum (Al). In some embodiments, the bonding wires BW may be connected by any one of a thermo compression connection method or an ultrasonic connection method, and also may be connected by a thermo sonic connection method combining these methods.

The molding member MB may protect the lower semiconductor chip 200 and the interposer 300 from external influences, e.g., contamination and impact. In order to perform such protection, a thickness of the molding member MB may be formed so as to at least cover the lower semiconductor chip 200 and the interposer 300.

For example, as illustrated in FIG. 1A, the molding member MB may extend, e.g., continuously, from the upper surface of the body portion 110 of the package substrate 100 along, e.g., entire, lateral surfaces of the lower semiconductor chip 200 and the interposer 300 to a height higher than an upper surface of the interposer 300 relative to a bottom of the package substrate 100. For example, as further illustrated in FIG. 1A, the molding member MB may extend along entire lateral surfaces of each of the pieces 300a of the interposer 300 to, e.g., completely, fill spaces between adjacent ones of the pieces 300a of the interposer 300. For example, as further illustrated in FIG. 1A, the molding member MB may cover at least partially the upper surface of the interposer 300, e.g., the molding member MB may expose at least partially upper surfaces of the bonding pads 321 on the upper surface of the interposer 300. A width of the molding member MB, e.g., a distance between outermost lateral surfaces of the molding member MB along the X direction, may be substantially the same as a width of the semiconductor package 10, e.g., along the X direction, because the molding member MB may cover all of the package substrate 100.

For example, the molding member MB may include an epoxy molding compound. The epoxy molding compound may have a thermal expansion coefficient of about 10 ppm/K to about 30 ppm/K. However, the molding member MB is not limited to an epoxy molding compound and may include various materials, e.g., an epoxy-based material, a thermosetting material, a thermoplastic material, a UV treatment material, and the like.

For example, after an appropriate amount of molding material is injected onto the package substrate 100 by an injection process, the molding member MB may form an outer shape of the semiconductor package 10 through a curing process. If necessary, by applying pressure to the molding material in a press process using a press, the outer shape of the semiconductor package 10 may be formed. Here, process conditions, e.g., delay time between injection of the molding material and pressing of the molding material, the amount of molding material to be injected, the pressing temperature and pressure, and the like, may be set considering physical properties, e.g., viscosity of the molding material and the like. Depending on the molding material, the thermal expansion coefficient of the molding member MB may vary.

An underfill UF may be formed between the package substrate 100 and the lower semiconductor chip 200. A gap may be formed between the package substrate 100 and the lower semiconductor chip 200 in the course of an electrical connection between the connection terminal 230 and the lower semiconductor chip 200. Such a gap may cause a problem in the connection reliability between the lower semiconductor chip 200 and the package substrate 100, and therefore, the underfill UF may be injected to reinforce the connection. In some cases, a molded underfill (MUF) process may be used instead of the underfill UF.

A general semiconductor package may include a package substrate, a semiconductor chip, an interposer, a molding member, and the like. In such a general semiconductor package, the materials constituting the package substrate, the semiconductor chip, the interposer, and the molding member may be different from each other, and each constituent element may have a different thermal expansion coefficient from each other. Therefore, when a temperature change occurs during the process of manufacturing the semiconductor package, each constituent element may shrink or expand differently from each other, resulting in deformation, e.g., warping, in the semiconductor package. Such a deformation of the semiconductor package is called warpage.

For example, in the general semiconductor package, the package substrate having a relatively large thermal expansion coefficient may contract at room temperature, thereby exerting tensile stress on the semiconductor chip and the interposer thereon. Further, at a high temperature, the package substrate having a relatively large thermal expansion coefficient may expand, thereby exerting compressive stress on the semiconductor chip and the interposer thereon. As such, warpage of the semiconductor package may occur due to stress concentration caused by the tensile or compressive stress, thereby reducing productivity and reliability of the semiconductor package.

In contrast, according to embodiments, the semiconductor package 10 includes the interposer 300 having the plurality of pieces 300a, i.e., portions 300a, spaced apart from each other with the molding member MB filled therebetween. As such, warpage of the semiconductor package 10 may be alleviated. That is, as components having a large thermal expansion coefficient, i.e., portions of the molding member MB, and components having a small thermal expansion coefficient, i.e., the pieces 300a of the interposer 300, may be appropriately, e.g., alternately, arranged, on a same plane, warpage of the semiconductor package 10 may be alleviated.

In detail, when the package substrate 100 having a relatively large thermal expansion coefficient shrinks at room temperature, the molding member MB, which also has a large thermal expansion coefficient and fills the spaces between the pieces 300a of the interposer 300, also shrinks. Therefore, the overall structure of the alternating pieces 300a and portions of the molding member MB in the interposer 300 may shrink, i.e., due to smaller spaces between adjacent pieces 300a caused by the shrinking molding member MB, thereby canceling out the tensile stress on the lower semiconductor chip 200 and the interposer 300. As such, warpage of the semiconductor package 10 may be alleviated.

Similarly, when the package substrate 100 having a relatively large thermal expansion coefficient expands at high temperature, the molding member MB, which also has a large thermal expansion coefficient and fills the spaces between the pieces 300a of the interposer 300, also expands. Therefore, the overall structure of the alternating pieces 300a and portions of the molding member MB in the interposer 300 may expand, i.e., due to larger spaces between adjacent pieces 300a caused by the expanding molding member MB, thereby canceling out the compressive stress on the lower semiconductor chip 200 and the interposer 300. As such, warpage of the semiconductor package 10 may be alleviated.

Accordingly, the semiconductor package 10 according to embodiments may minimize stress concentration caused by the warpage. Therefore, the productivity and reliability of the semiconductor package 10 may be enhanced.

FIGS. 2A to 9B are diagrams illustrating semiconductor packages according to example embodiments. Most of the components constituting semiconductor packages 20 to 90 described below and the material constituting the components are substantially the same as or similar to those described with reference to FIGS. 1A to 1D. Therefore, for convenience of explanation, only the differences relative to the semiconductor package 10 (see FIG. 1A) described above will be described in detail.

Figure 2A:
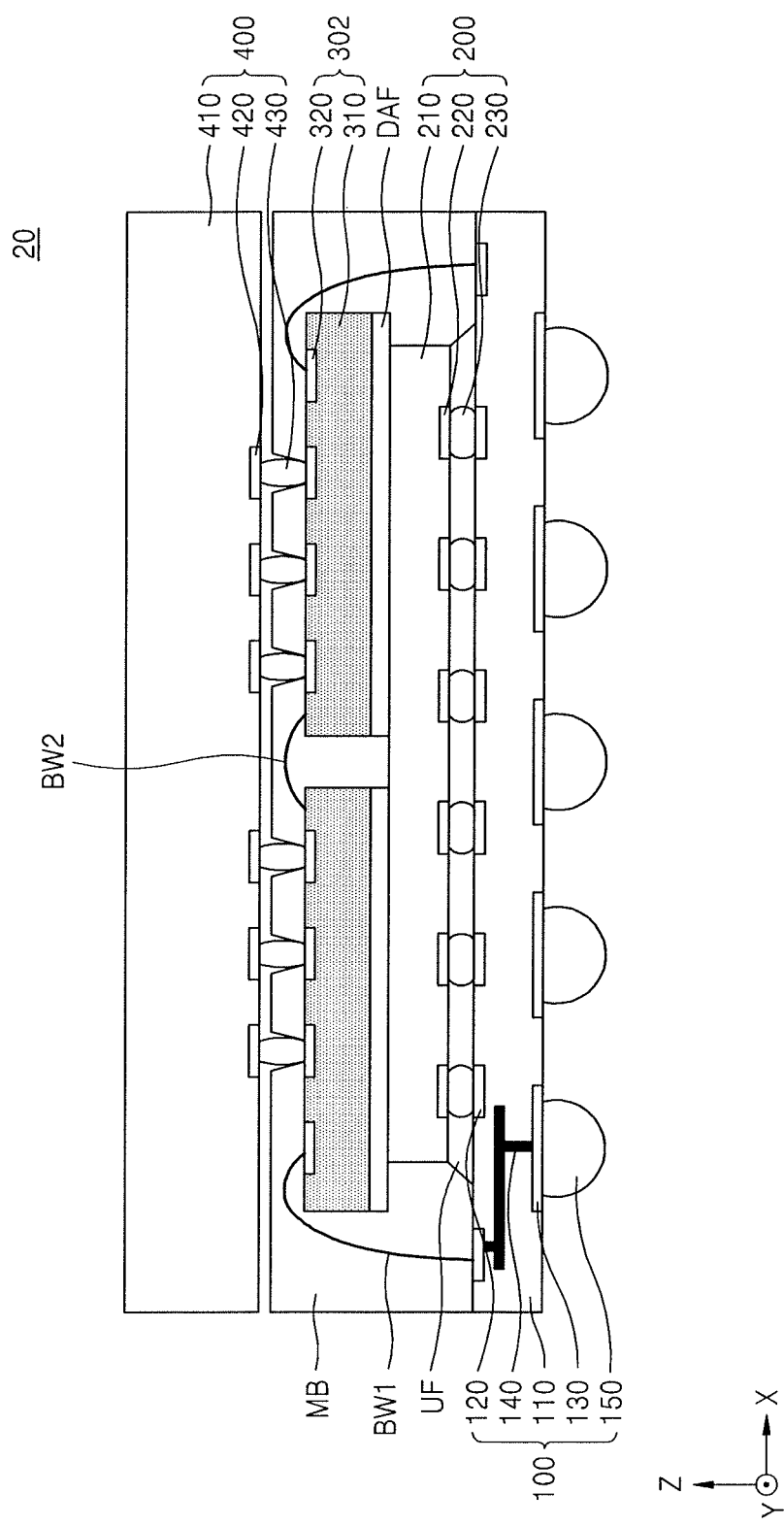
FIGS. 2A to 9B illustrate diagrams of semiconductor packages according to example embodiments.
Figure 2B:
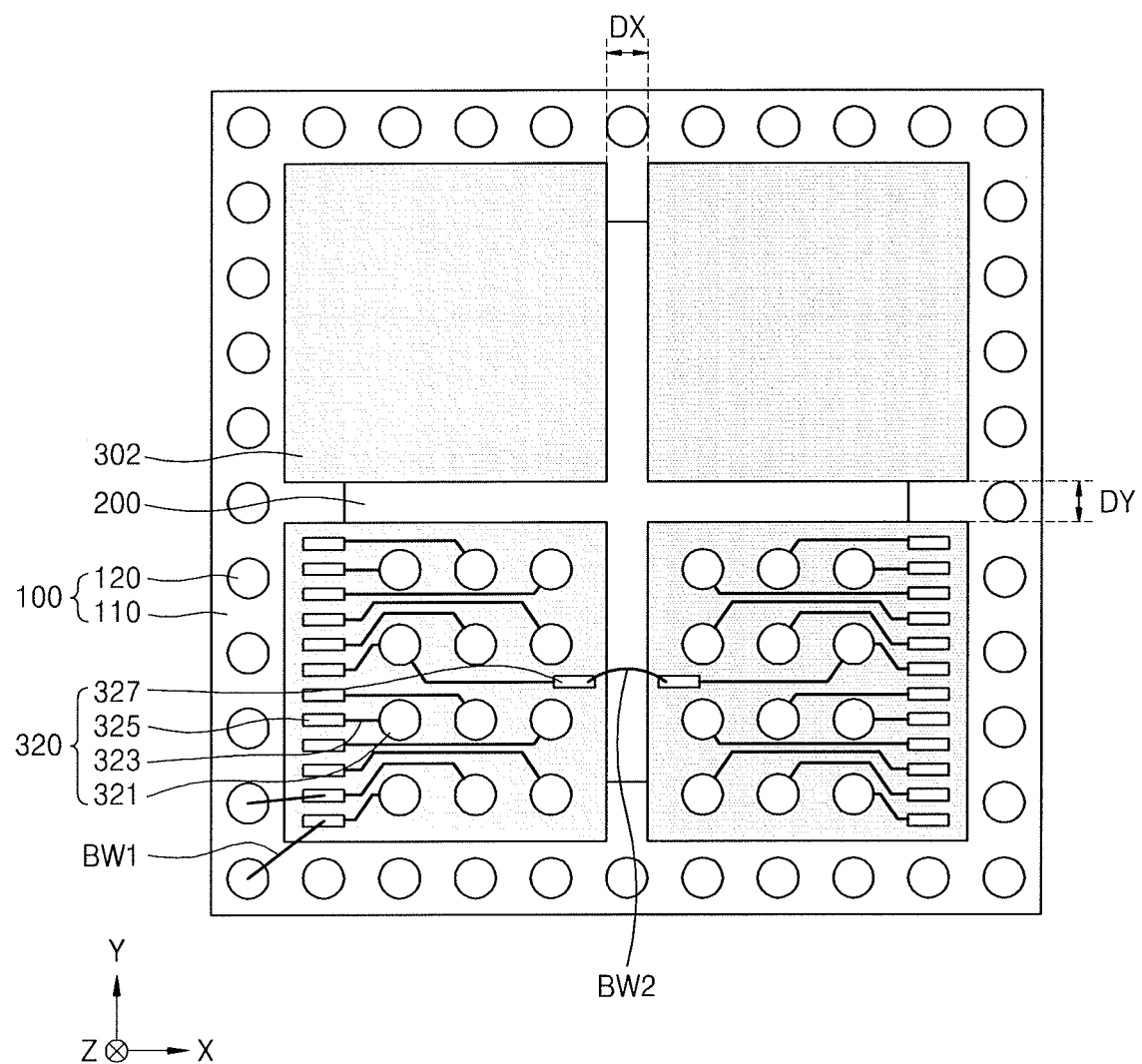

Referring to FIGS. 2A and 2B, FIG. 2A is a cross-sectional view of a semiconductor package 20, and FIG. 2B is a plan view of the semiconductor package 20. For convenience of explanation, the molding member MB and the upper semiconductor chip 400 are omitted in FIG. 2B.

As illustrated in FIGS. 2A and 2B together, the semiconductor package 20 may include the package substrate 100, the lower semiconductor chip 200, an interposer 302 including a plurality of pieces spaced apart form each other, the upper semiconductor chip 400, and first and second bonding wires BW1 and BW2. The first bonding wire BW1 may electrically connect the package substrate 100 to the interposer 302, and the second bonding wire BW2 may electrically connect pieces of the interposers 302 to each other.

In detail, a second bonding pads 327 may be disposed on each piece of the interposer 302, and the second bonding wire BW2 may be formed to connect second bonding pads 327 of adjacent pieces of the interposer 302 to each other. The second bonding wire BW2 may enable various wiring designs for signal transmission with the upper semiconductor chip 400 by electrically connecting the plurality of the pieces of the interposer 302 to each other. The numbers of second bonding pads 327 and second bonding wires BW2 and the arrangement thereof are illustratively shown, and are not limited thereto.

Figure 3A:
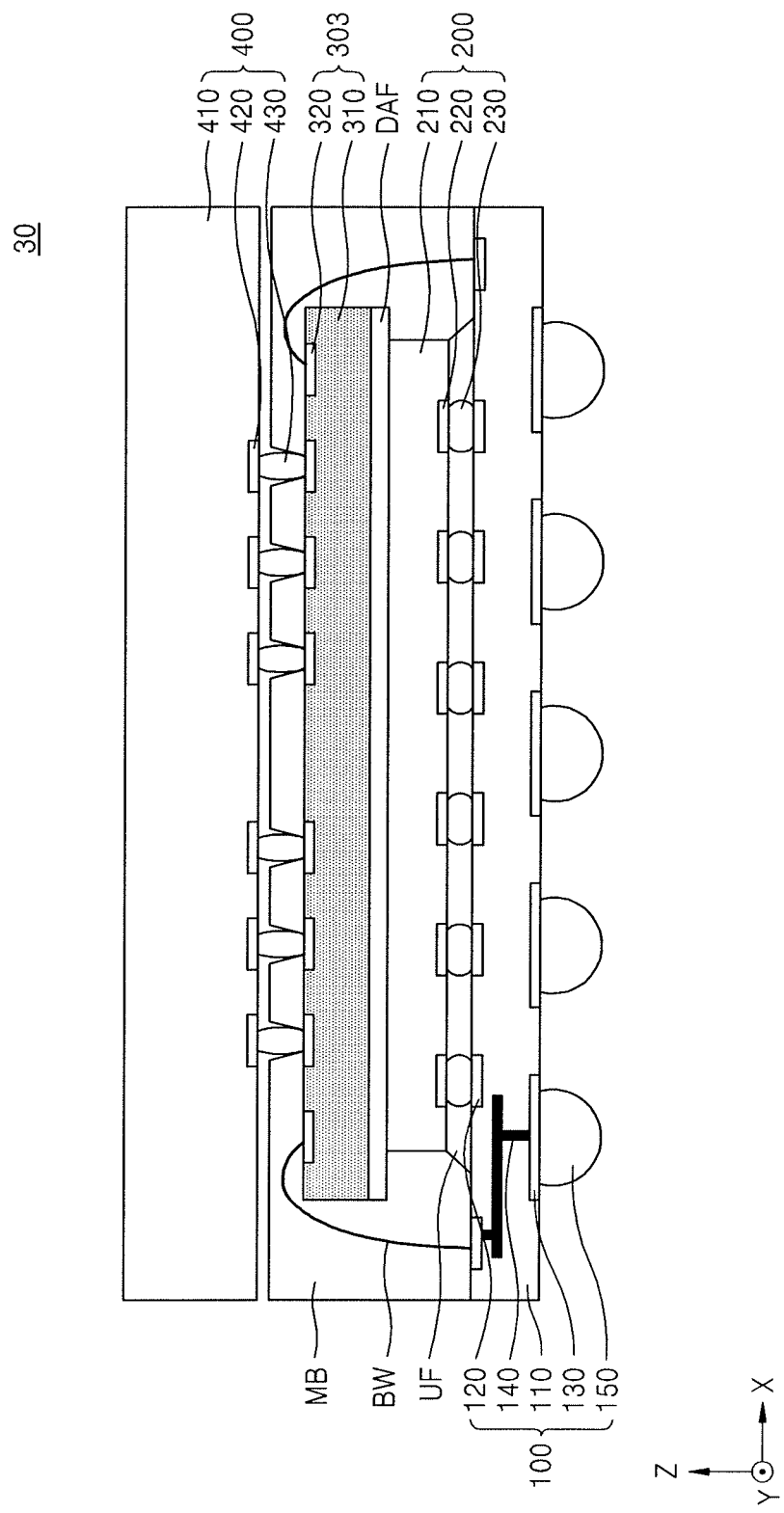
Figure 3B:
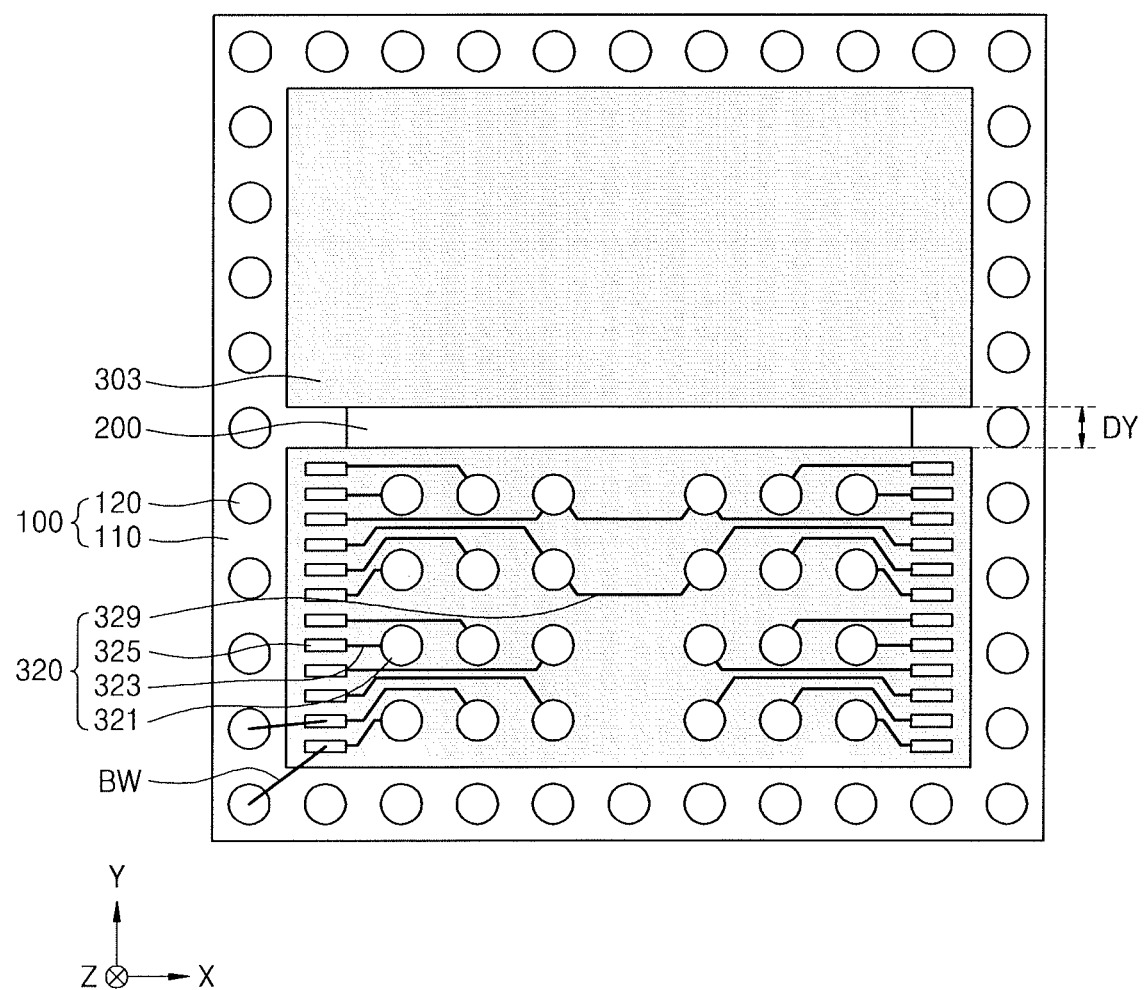

Referring to FIGS. 3A and 3B, FIG. 3A is a cross-sectional view of a semiconductor package 30, and FIG. 3B is a plan view of the semiconductor package 30. For convenience of explanation, the molding member MB and the upper semiconductor chip 400 are omitted in FIG. 3B.

As illustrated in FIGS. 3A and 3B together, the semiconductor package 30 may include the package substrate 100, the lower semiconductor chip 200, an interposer 303 composed of two pieces, and the upper semiconductor chip 400. In the semiconductor package 30, the interposer 303 may be divided into, e.g., only, two pieces. That is, the interposer 303 may still include 2N pieces (N is 1), and in a plan view, the two pieces may be arranged in a symmetrical structure.

Further, the interposer 303 may be configured such that the two pieces are arranged apart from each other by a second distance DY in the second direction (the Y direction). The two pieces may be configured to have the same areas or different areas.

Further, a second redistribution layer 329 may be formed on the interposer 303 to enable various wiring designs for signal transmission with the upper semiconductor chip 400. The number of second redistribution layers 329 and the arrangement thereof are illustratively shown, and are not limited thereto.

Figure 4A:
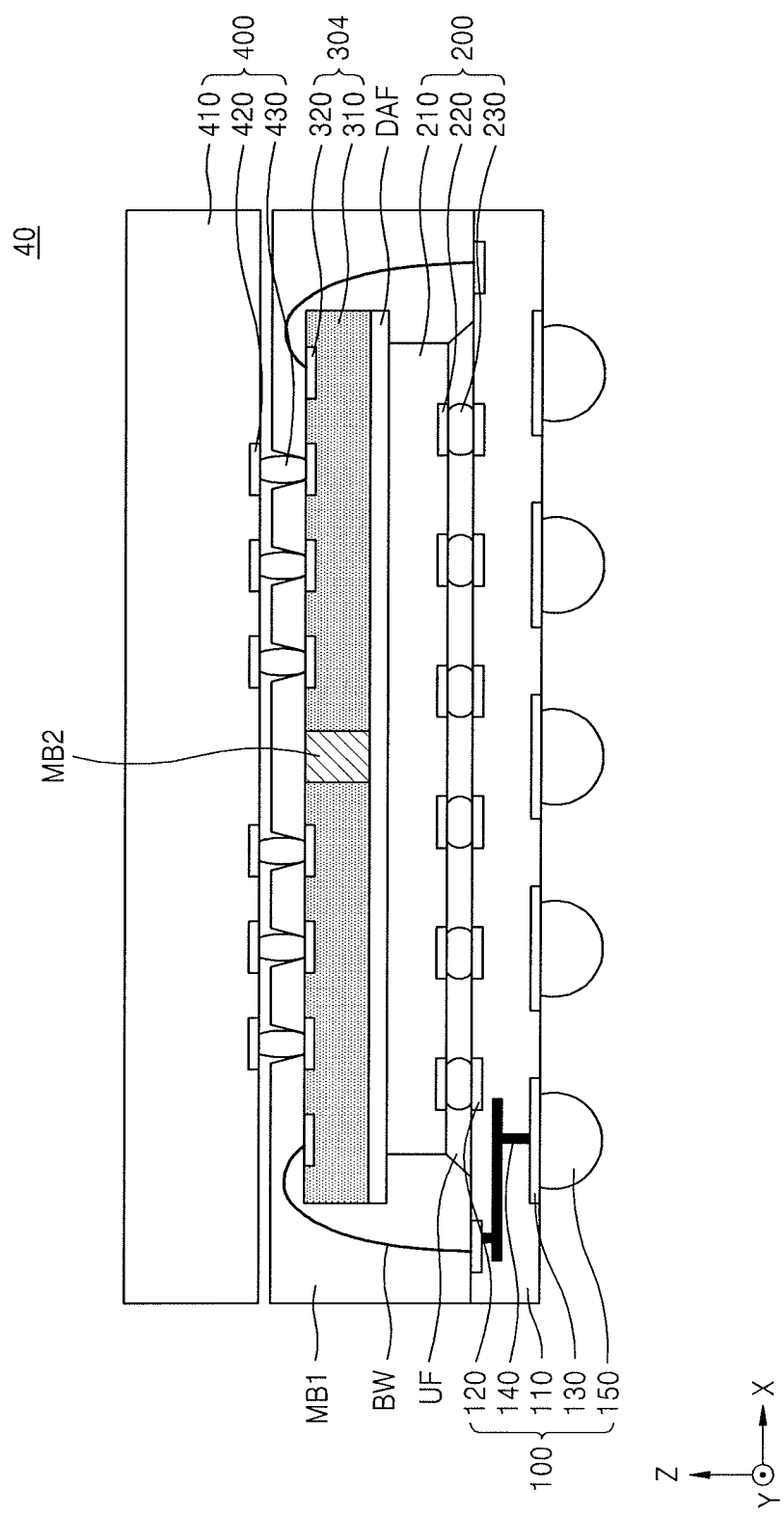
Figure 4B:
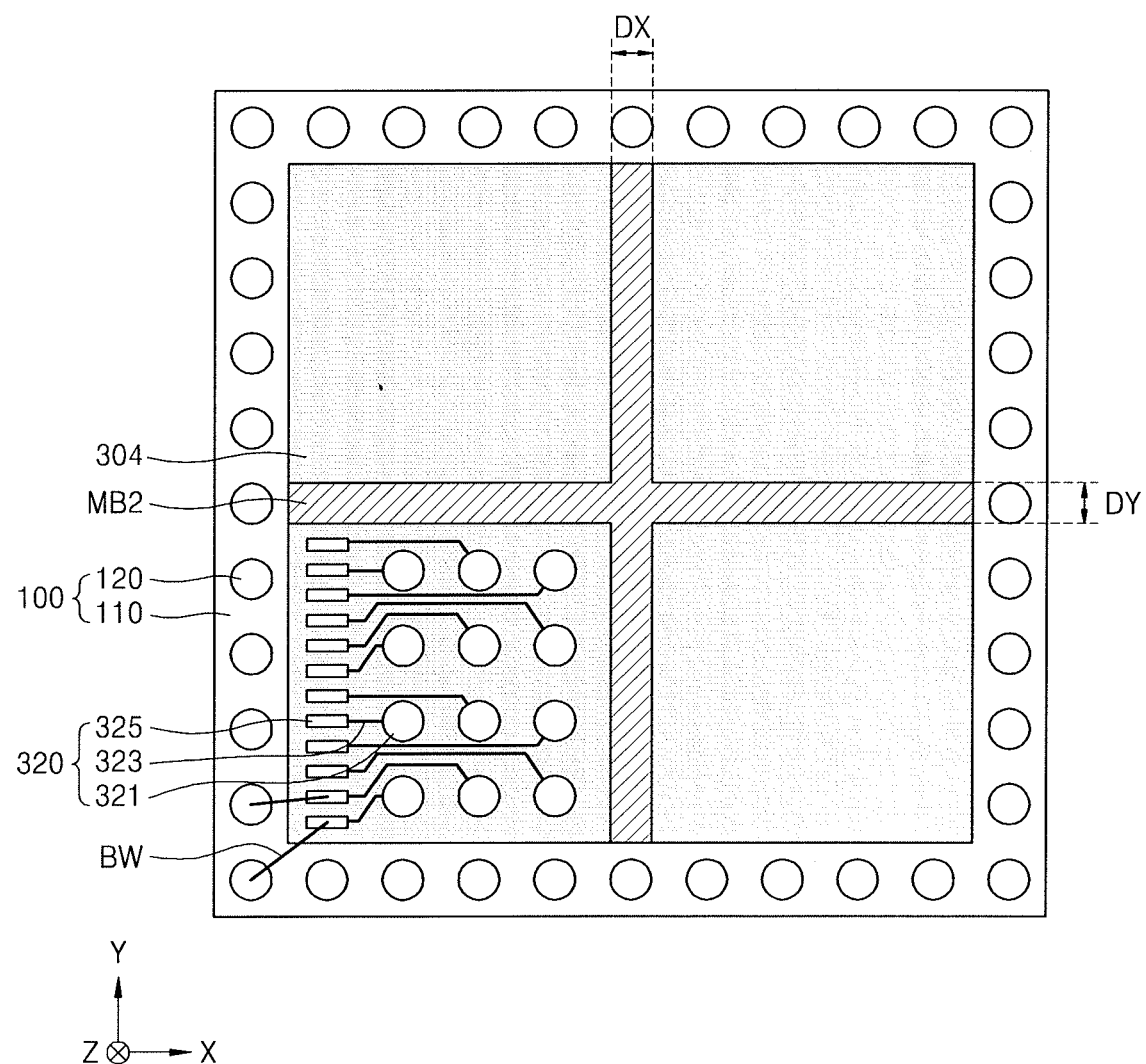

Referring to FIGS. 4A and 4B, FIG. 4A is a cross-sectional view of a semiconductor package 40, and FIG. 4B is a plan view of the semiconductor package 40. For convenience of explanation, a first molding member MB1 and the upper semiconductor chip 400 are omitted in FIG. 4B.

As illustrated in FIGS. 4A and 4B together, the semiconductor package 40 may include the package substrate 100, the lower semiconductor chip 200, an interposer 304 including a plurality of pieces, the upper semiconductor chip 400, and first and second molding members MB1 and MB2. The first molding member MB1 may be formed, e.g., only, on an outer portion of the lower semiconductor chip 200 and the interposer 304. The second molding member MB2 may be formed in spaces between the plurality of pieces of the interposer 304 (hatched region in FIGS. 4A and 4B).

In detail, in the semiconductor package 40, a molding member may include at least two portions having different thermal expansion coefficients from each other. In some embodiments, the semiconductor package 40 may include the first molding member MB1 and the second molding member MB2 having different thermal expansion coefficients from each other. For example, the thermal expansion coefficient of the first molding member MB1 may be smaller than the thermal expansion coefficient of the second molding member MB2. That is, considering the thermal expansion coefficients of the first molding member MB1 and the second molding member MB2, the tensile stress and compressive stress applied to the semiconductor package 40 may be effectively controlled to minimize the warpage.

Figure 5A:
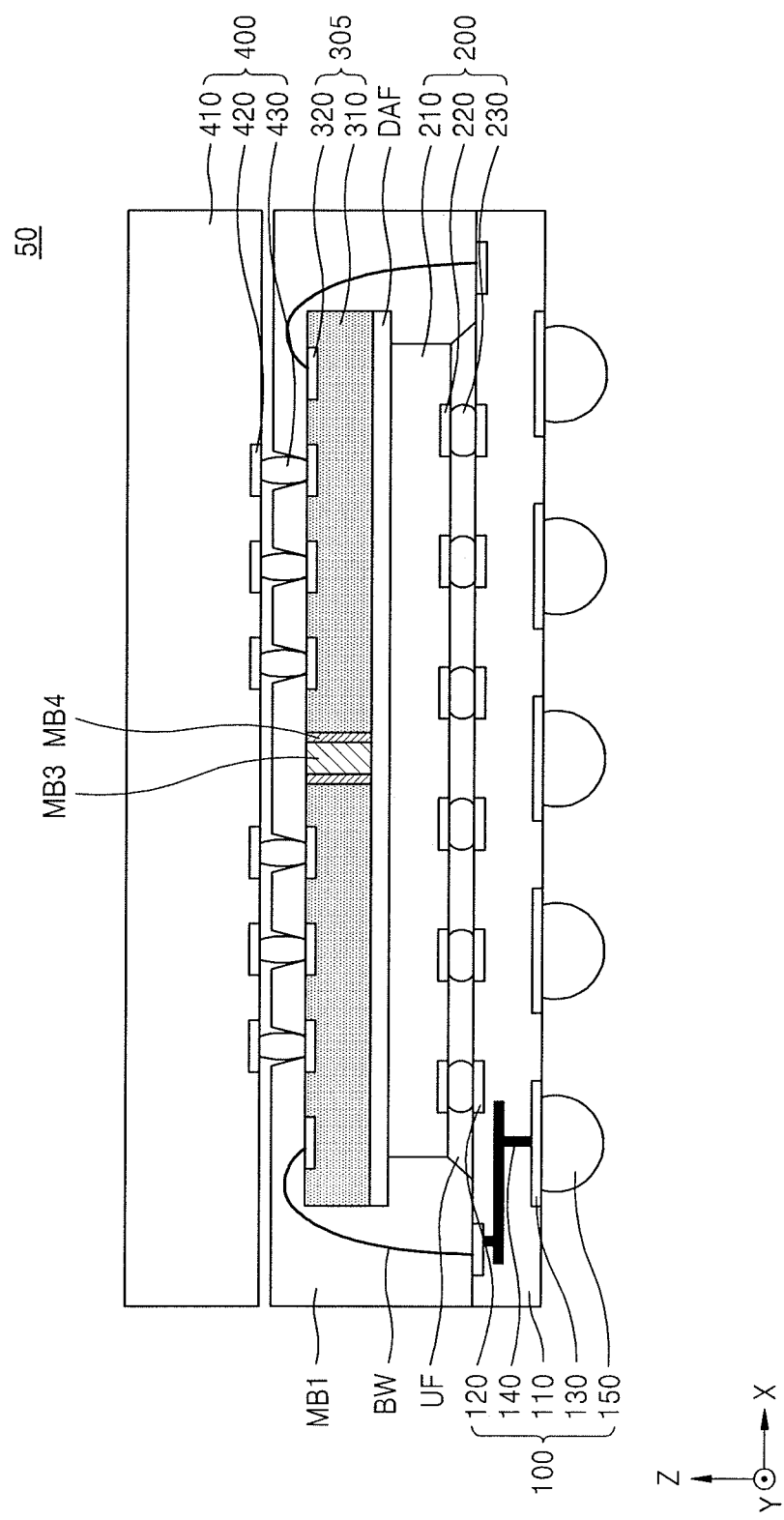
Figure 5B:
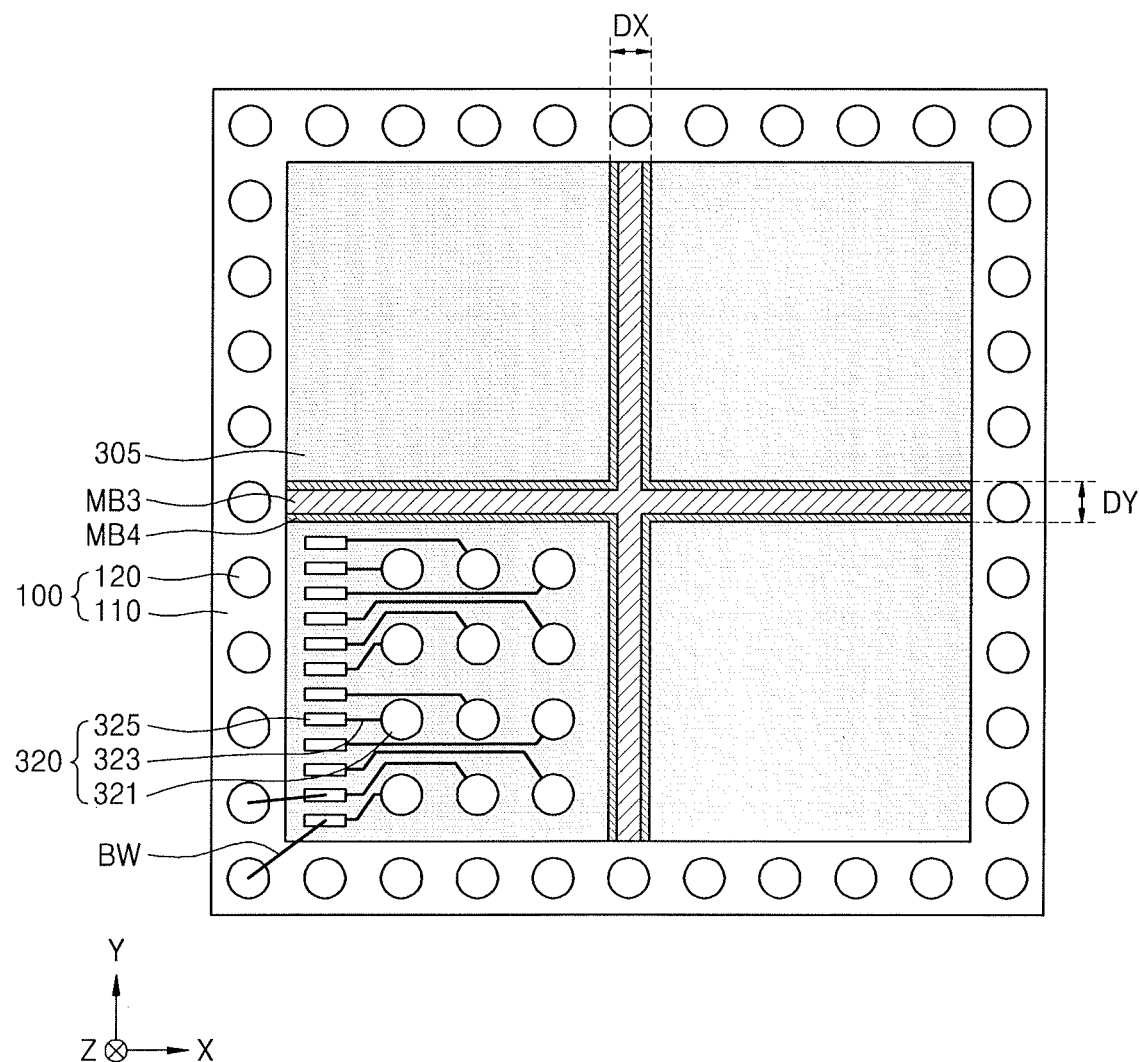

Referring to FIGS. 5A and 5B, FIG. 5A is a cross-sectional view of a semiconductor package 50, and FIG. 5B is a plan view of the semiconductor package 50. For convenience of explanation, the first molding member MB1 and the upper semiconductor chip 400 are omitted in FIG. 5B.

As illustrated in FIGS. 5A and 5B, the semiconductor package 50 may include the package substrate 100, the lower semiconductor chip 200, an interposer 305 including a plurality of pieces, the upper semiconductor chip 400, the first molding member MB1, and third and fourth molding members MB3 and MB4 filling the spaces between the pieces of the interposer 305.

In detail, the semiconductor package 50 may include the third and fourth molding member MB3 and MB4 formed in a space between the plurality of pieces of the interposer 305, and the first molding member MB1 formed on the outer portion of the lower semiconductor chip 200 and the interposer 305.

The third molding member MB3 may include a conductive material. For example, the third molding member MB3 may include a metal, e.g., copper (Cu), aluminum (Al), titanium (It), tantalum (Ta), tungsten (W), nickel (Ni) and a combination thereof, a metal paste containing the metal, or a metal tape containing the metal. The third molding member MB3 may serve to dissipate heat generated in the lower semiconductor chip 200.

The fourth molding member MB4 may include an insulating material. That is, the fourth molding member MB4 may prevent a short circuit between the third molding member MB3 and the interposer 305.

Further, in the semiconductor package 50, a molding member may include at least three portions having different thermal expansion coefficients from each other. In some embodiments, the semiconductor package 50 may include the first molding member MB1, the third molding member MB3, and the fourth molding member MB4 having different thermal expansion coefficients from each other. That is, considering the thermal expansion coefficients of the first molding member MB1, the third molding member MB3, and the fourth molding member MB4, the tensile stress and compressive stress applied to the semiconductor package 50 may be effectively controlled to minimize the warpage.

Figure 6A:
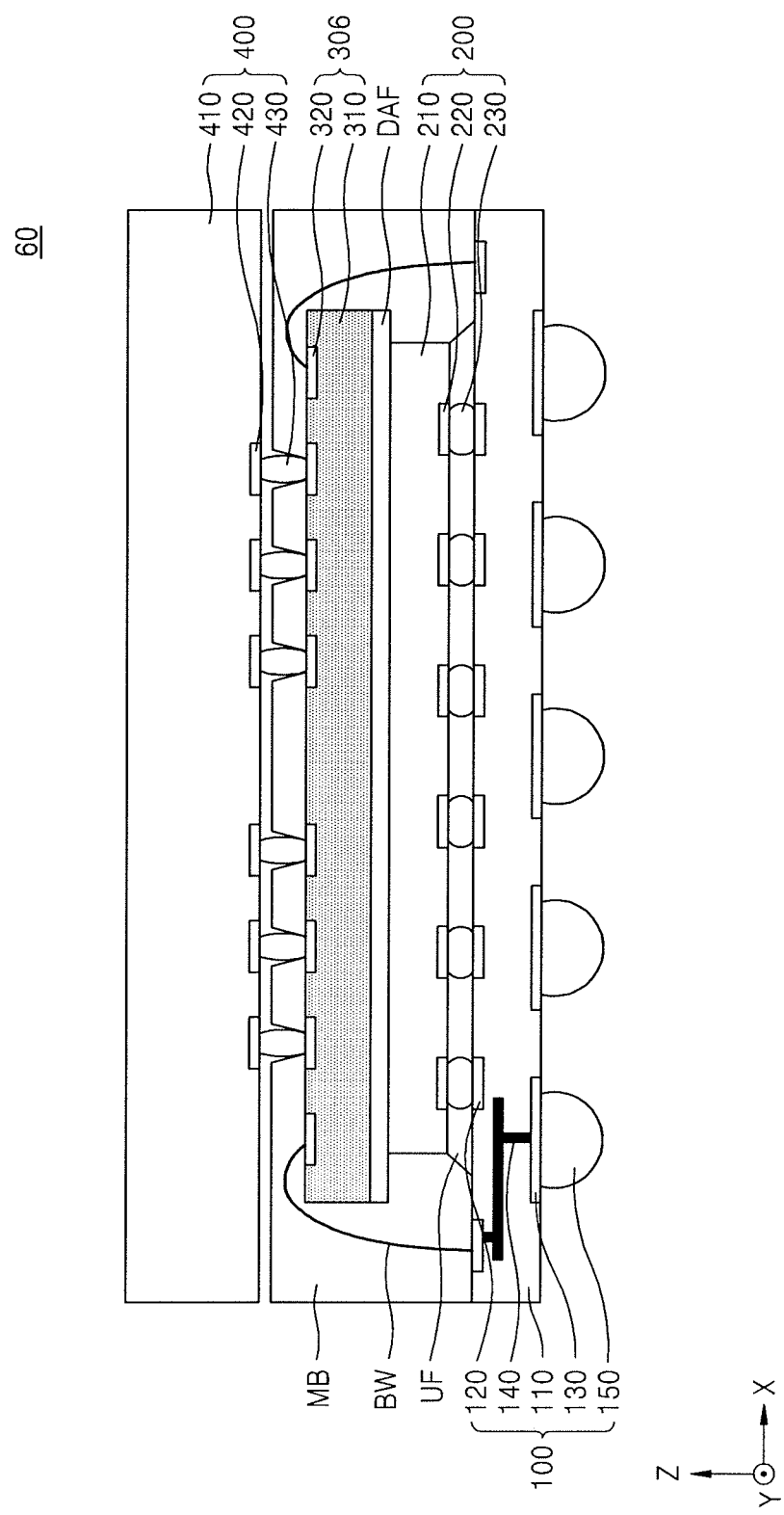
Figure 6B:
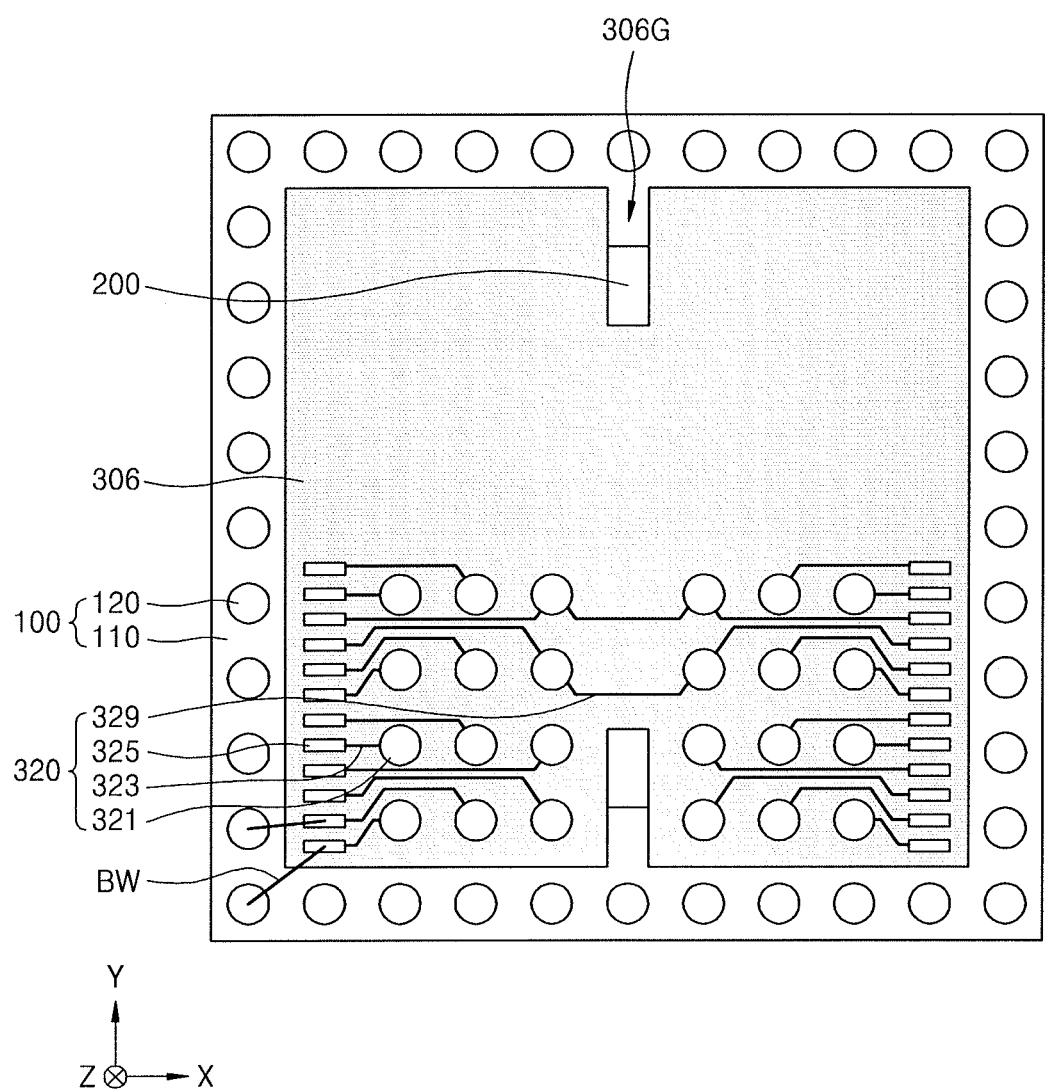
Figure 6C:
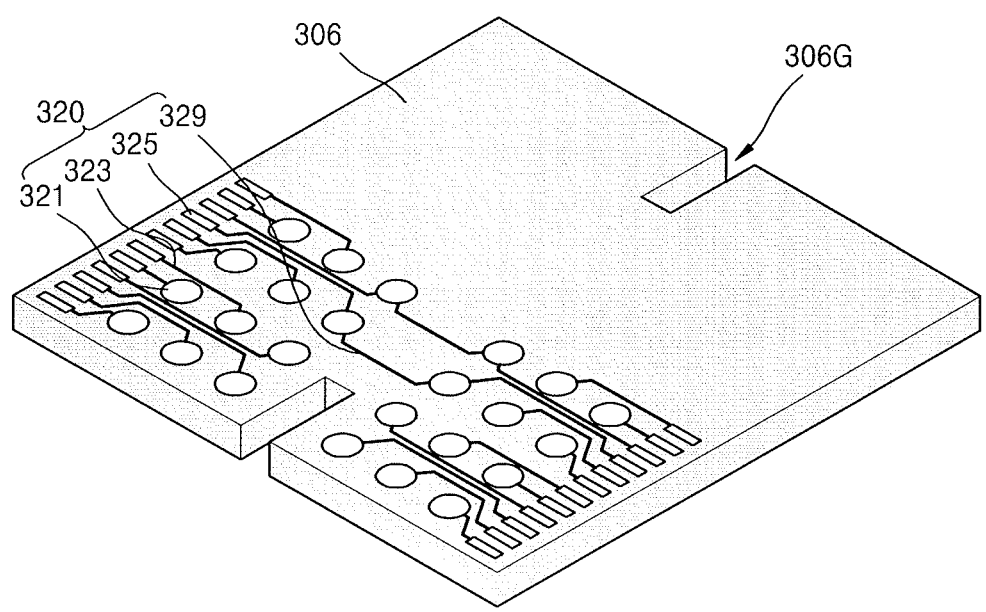

Referring to FIGS. 6A-6C, FIG. 6A is a cross-sectional view of a semiconductor package 60, FIG. 6B is a plan view of the semiconductor package 60, and FIG. 6C is a perspective view of an interposer 306. For convenience of explanation, the molding member MB and the upper semiconductor chip 400 are omitted in FIG. 6B.

As illustrated in FIGS. 6A to 6C together, the semiconductor package 60 may include the package substrate 100, the lower semiconductor chip 200, an interposer 306 partitioned into a plurality of regions through a groove 306G formed on a side surface thereof, and the upper semiconductor chip 400. That is, the plurality of regions of the interposer 306 may be partially connected to each other, while being only partially separated via the groove 306G.

In detail, the semiconductor package 60 may include the interposer 306 that is partitioned into a plurality of regions through groove 306G formed on the side surface thereof. The number of the grooves 306G may be 2N (N is a natural number), and the grooves 306G may be arranged to face each other in a plan view. In addition, an end of the groove 306G may meet an edge of the interposer 306. For example, as illustrated in FIG. 6C, each of the grooves 306G may extend through an entire thickness of the interposer 306, e.g., along the Z direction. For example, as further illustrated in FIG. 6C, each of the grooves 306G may extend only partially, e.g., along the Y direction, so a length of one groove 306G, e.g., along the Y direction, may be smaller than a distance between two facing grooves 306G, e.g., along the Y direction. As illustrated in FIG. 6B, a portion of the upper surface of the lower semiconductor chip 200 which overlaps with the groove 306G may be opened from the interposer 306, e.g., the lower semiconductor chip 200 may be exposed through the groove 306G.

In the semiconductor package 60, the interposer 306 may include the groove 306G on the side surface thereof, and the groove 306G may be filled with the molding member MB. The thermal expansion coefficient of the interposer 306 may be different from the thermal expansion coefficient of the molding member MB.

Further, a second redistribution layer 329 may be formed on the interposer 306 to enable various wiring designs for signal transmission with the upper semiconductor chip 400.

The number of second redistribution layers 329 and the arrangement thereof are illustratively shown, and are not limited thereto.

Figure 7A:
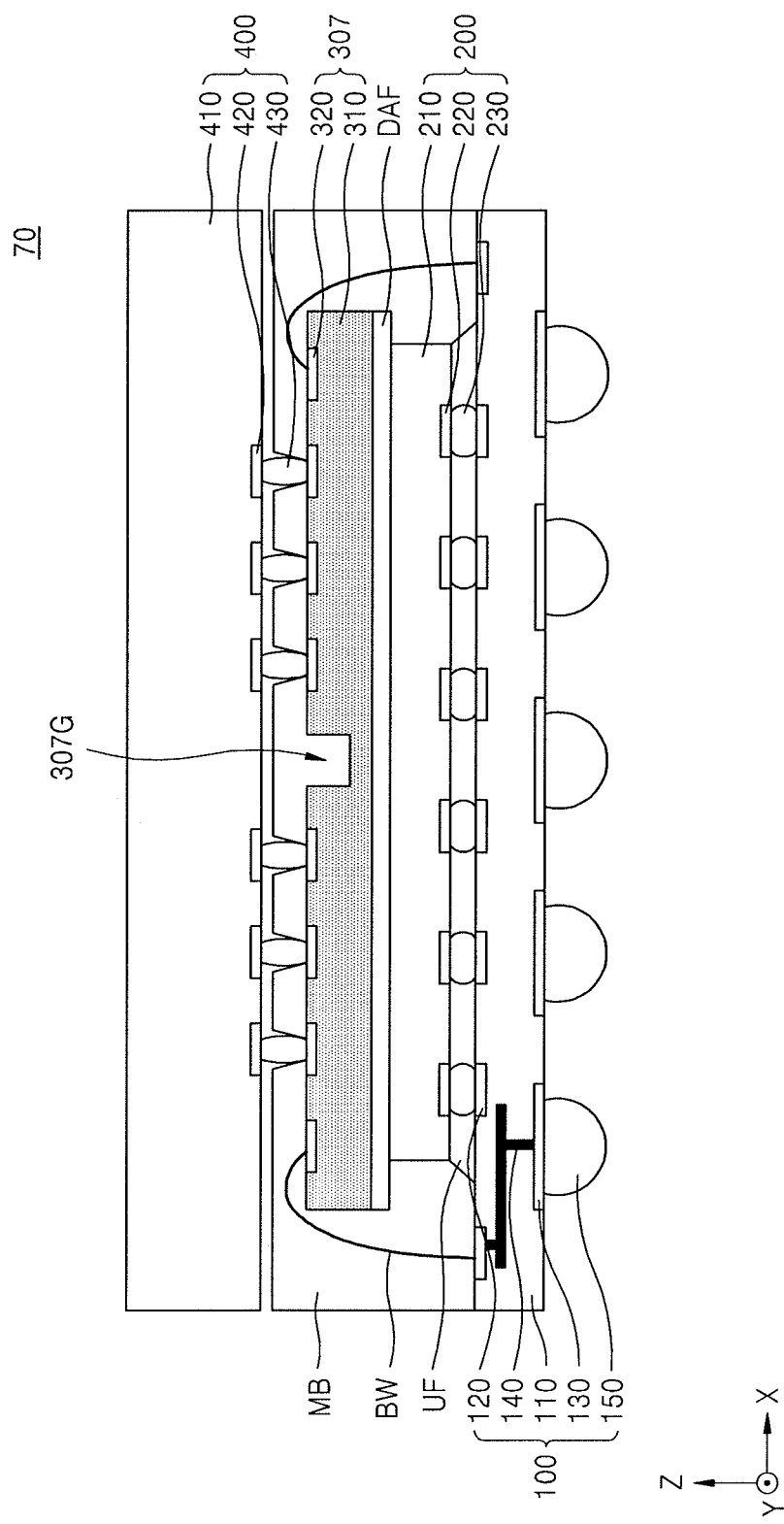
Figure 7B:
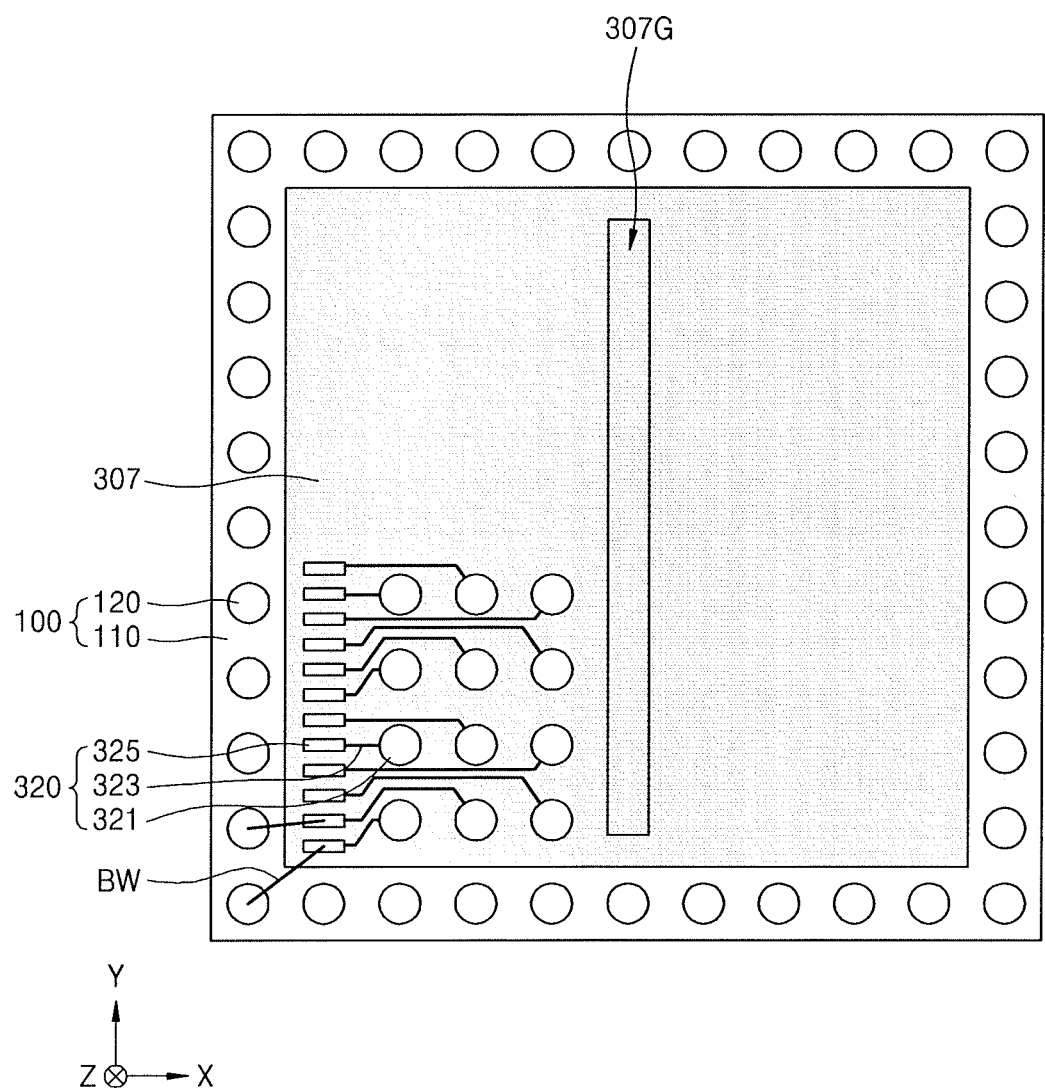
Figure 7C:
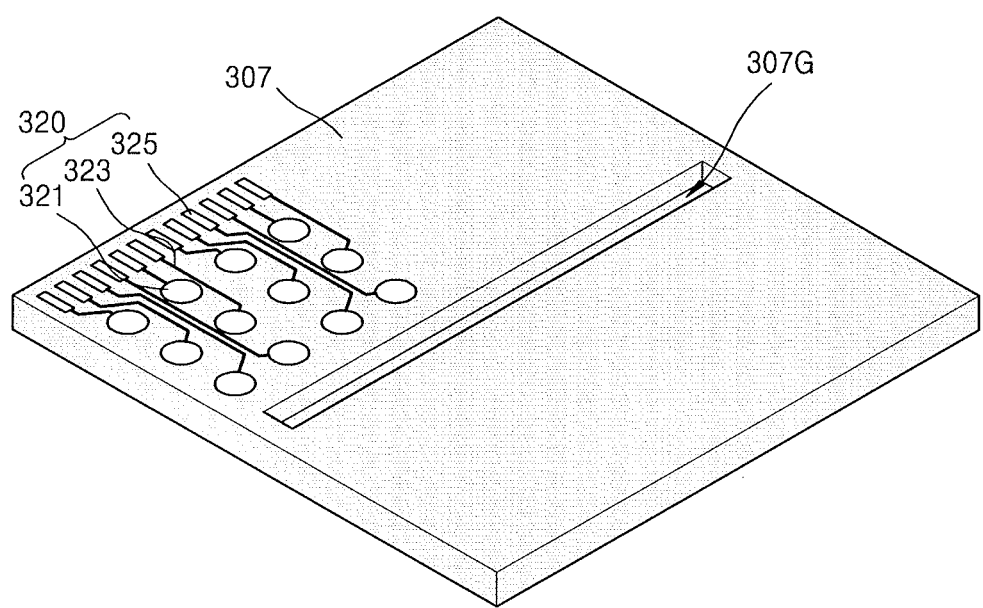

Referring to FIGS. 7A to 7C, FIG. 7A is a cross-sectional view of a semiconductor package 70, FIG. 7B is a plan view of the semiconductor package 70, and FIG. 7C is a perspective view of the interposer 307. For convenience of explanation, the molding member MB and the upper semiconductor chip 400 are omitted in FIG. 7B.

As illustrated in FIGS. 7A-7C, the semiconductor package 70 may include the package substrate 100, the lower semiconductor chip 200, an interposer 307 partitioned into a plurality of regions through a groove 307G formed on an upper surface thereof, and the upper semiconductor chip 400. That is, the groove 307G may extend only partially into the interposer 307 along the Z direction.

In detail, the semiconductor package 70 may include the interposer 307 that is partitioned into the plurality of regions through groove 307G formed on the upper surface thereof. The groove 307G may extend parallel to an edge of the interposer 307, and a depth of the groove 307G may be greater than half of a thickness of the interposer 307, e.g., along the Z direction. In addition, both ends of the groove 307G may be spaced apart from the edge of the interposer 307.

For example, the groove 307G may be linear and continuous along its entire length, e.g., along the Y direction (FIG. 7C). In another example, the groove 307G may include a plurality of grooves, and at least two of the grooves 307G may be formed to cross each other. That is, the plurality of grooves 307G, each extending in the first direction (the X direction) and the second direction (the Y direction), may be formed.

In the semiconductor package 70, the interposer 307 may include the groove 307G on the upper surface thereof, and the groove 307G may be filled with the molding member MB. The thermal expansion coefficient of the interposer 307 may be different from the thermal expansion coefficient of the molding member MB.

The molding member MB may include first and second molding members. That is, the molding member may include a second molding member that fills the groove 307G and a first molding member formed on an outer portion of the lower semiconductor chip 200 and the interposer 307, e.g., as discussed previously with reference to FIGS. 4A and 4B. The thermal expansion coefficient of the first molding member and the thermal expansion coefficient of the second molding member may be different from each other.

Figure 8A:
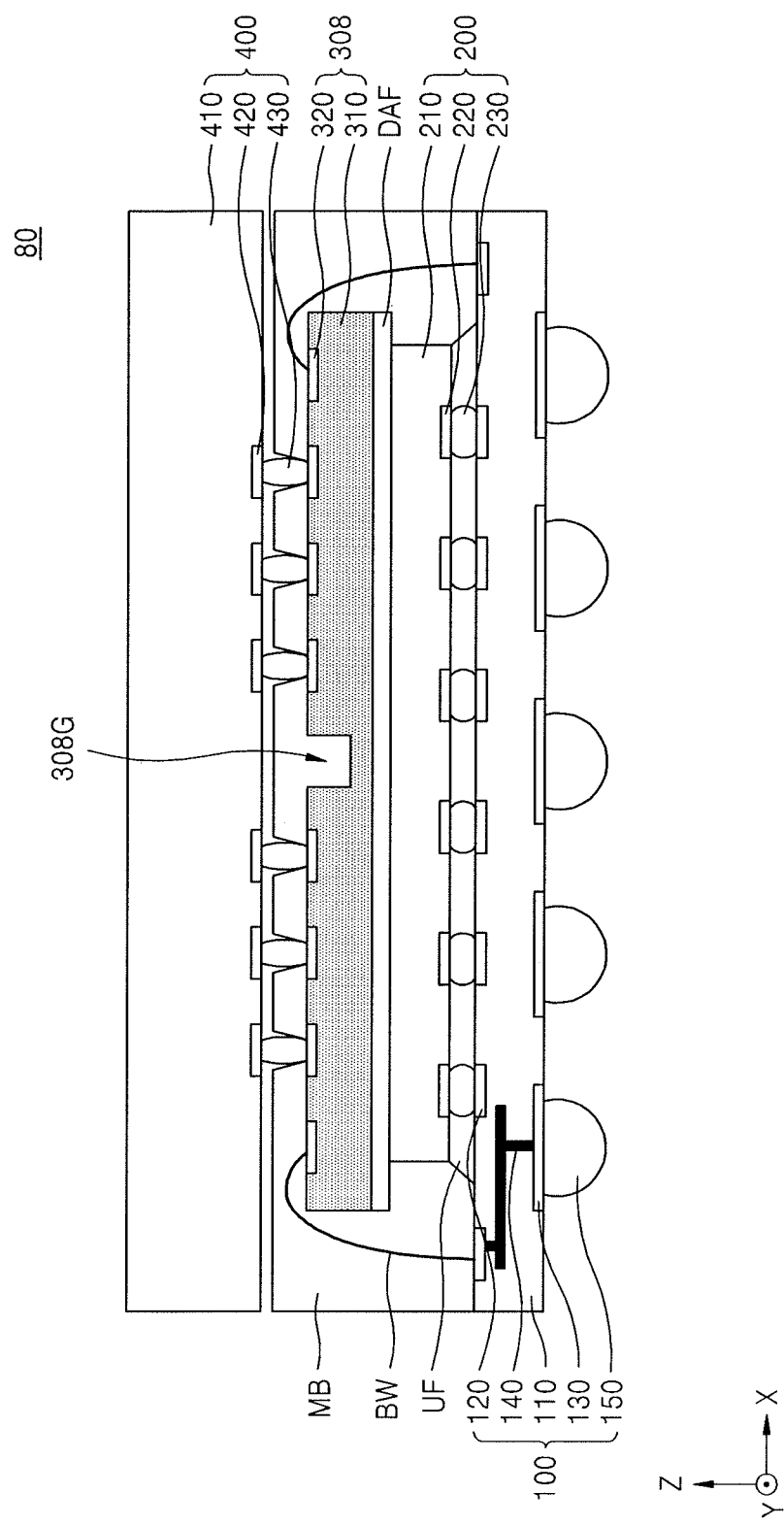
Figure 8B:
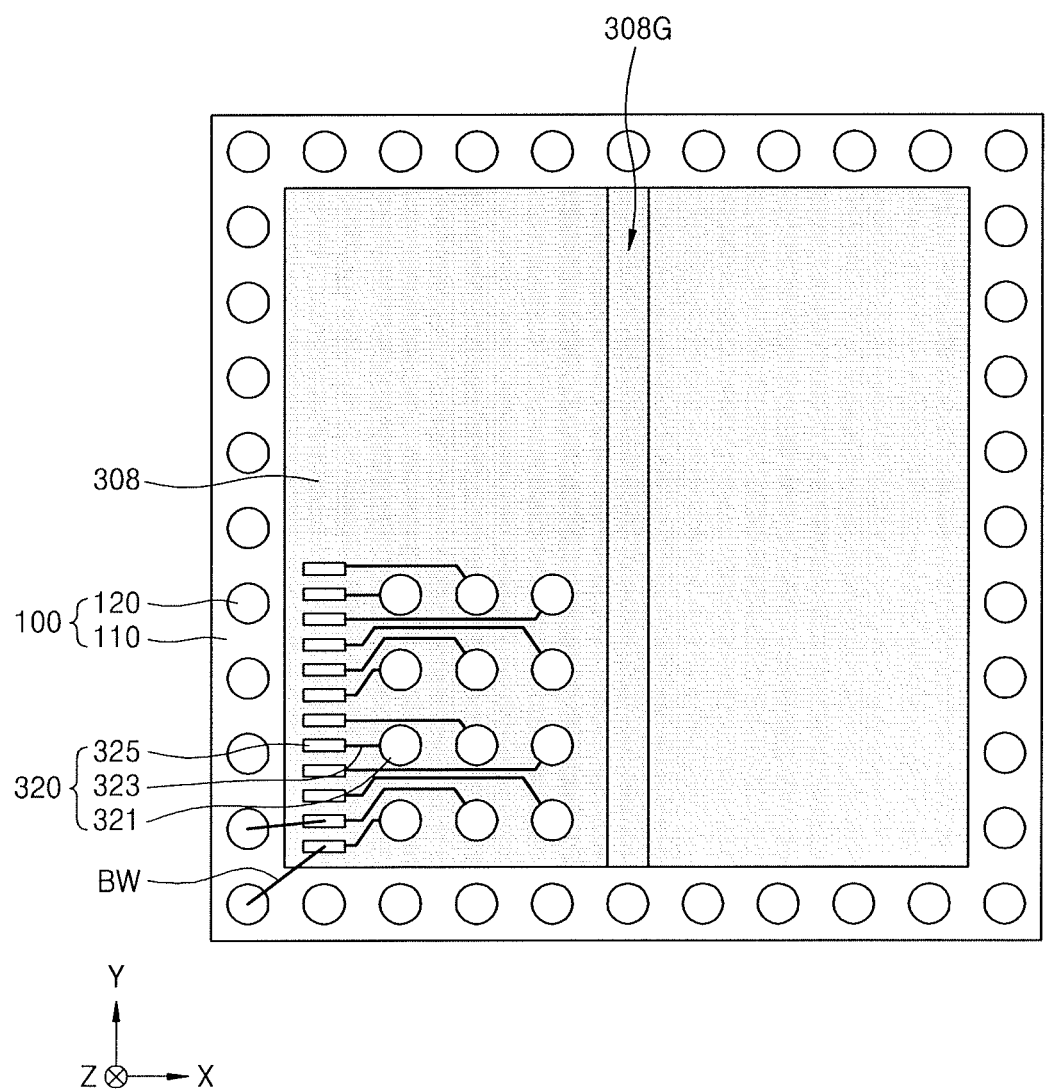
Figure 8C:
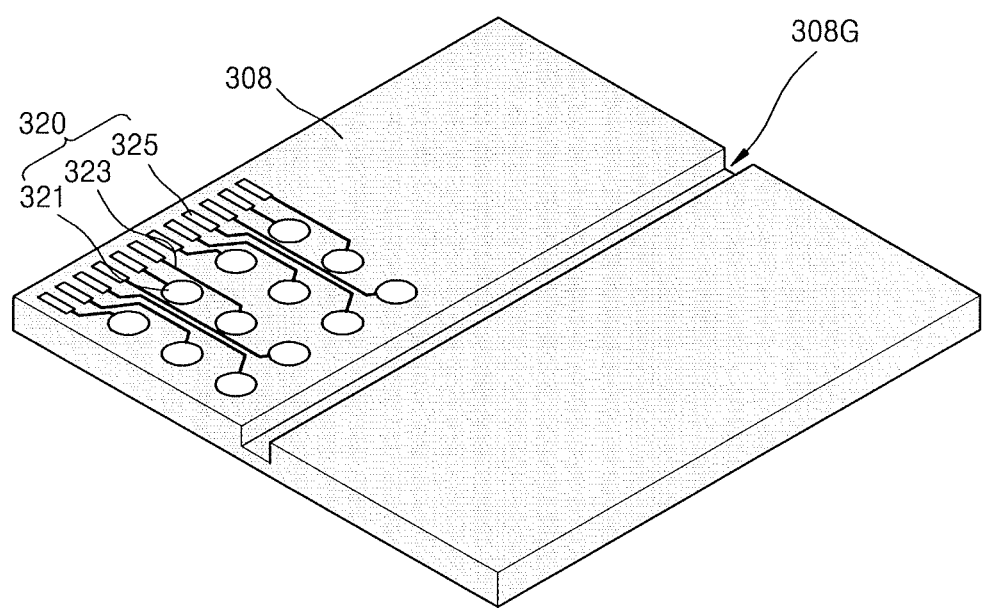

Referring to FIGS. 8A to 8C, FIG. 8A is a cross-sectional view of a semiconductor package 80, FIG. 8B is a plan view of the semiconductor package 80, and FIG. 8C is a perspective view of the interposer 308. For convenience of explanation, the molding member MB and the upper semiconductor chip 400 are omitted in FIG. 8B.

As illustrated in FIGS. 8A to 8C, the semiconductor package 80 may include the package substrate 100, the lower semiconductor chip 200, an interposer 308 partitioned into a plurality of regions through a groove 308G formed on an upper surface thereof, and the upper semiconductor chip 400. That is, the groove 307␣8 may extend only partially into the interposer 307 along the Z direction.

In detail, the semiconductor package 80 may include the interposer 308 that is partitioned into the plurality of regions through groove 308G formed on the upper surface thereof. The groove 308G may extend parallel to an edge of the interposer 308, and a depth of the groove 308G may be greater than half of a thickness of the interposer 308, e.g., along the Z direction. In addition, an end of the groove 308G may meet an edge of the interposer 308, e.g., a length of the groove 308G along the Y direction may equal a length of the interposer 308 along the Y direction.

For example, the groove 308G may be linear and continuous, e.g., along the Y direction. In another example, the groove 308G may include a plurality of grooves, and at least two of the grooves 308G may be formed to cross each other. That is, the plurality of grooves 308G, each extending in the first direction (the X direction) and the second direction (the Y direction), may be formed.

In the semiconductor package 80, the interposer 308 may include the groove 308G on the upper surface thereof, and the groove 308G may be filled with the molding member MB. The thermal expansion coefficient of the interposer 308 may be different from the thermal expansion coefficient of the molding member MB.

The molding member MB may include a second molding member that fills the groove 308G and a first molding member formed on an outer portion of the lower semiconductor chip 200 and the interposer 307. The thermal expansion coefficient of the first molding member and the thermal expansion coefficient of the second molding member may be different from each other.

Figure 9A:
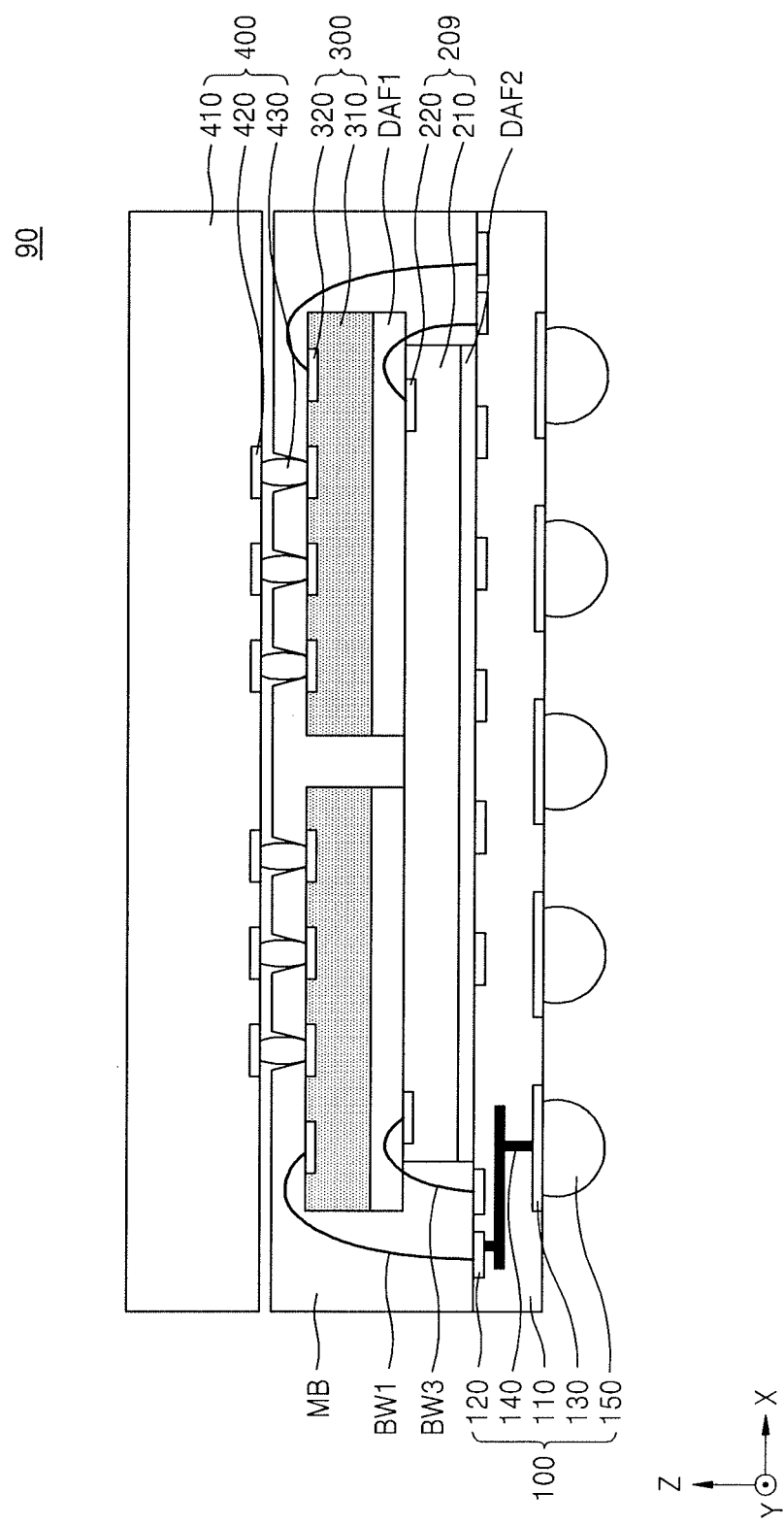
Figure 9B:
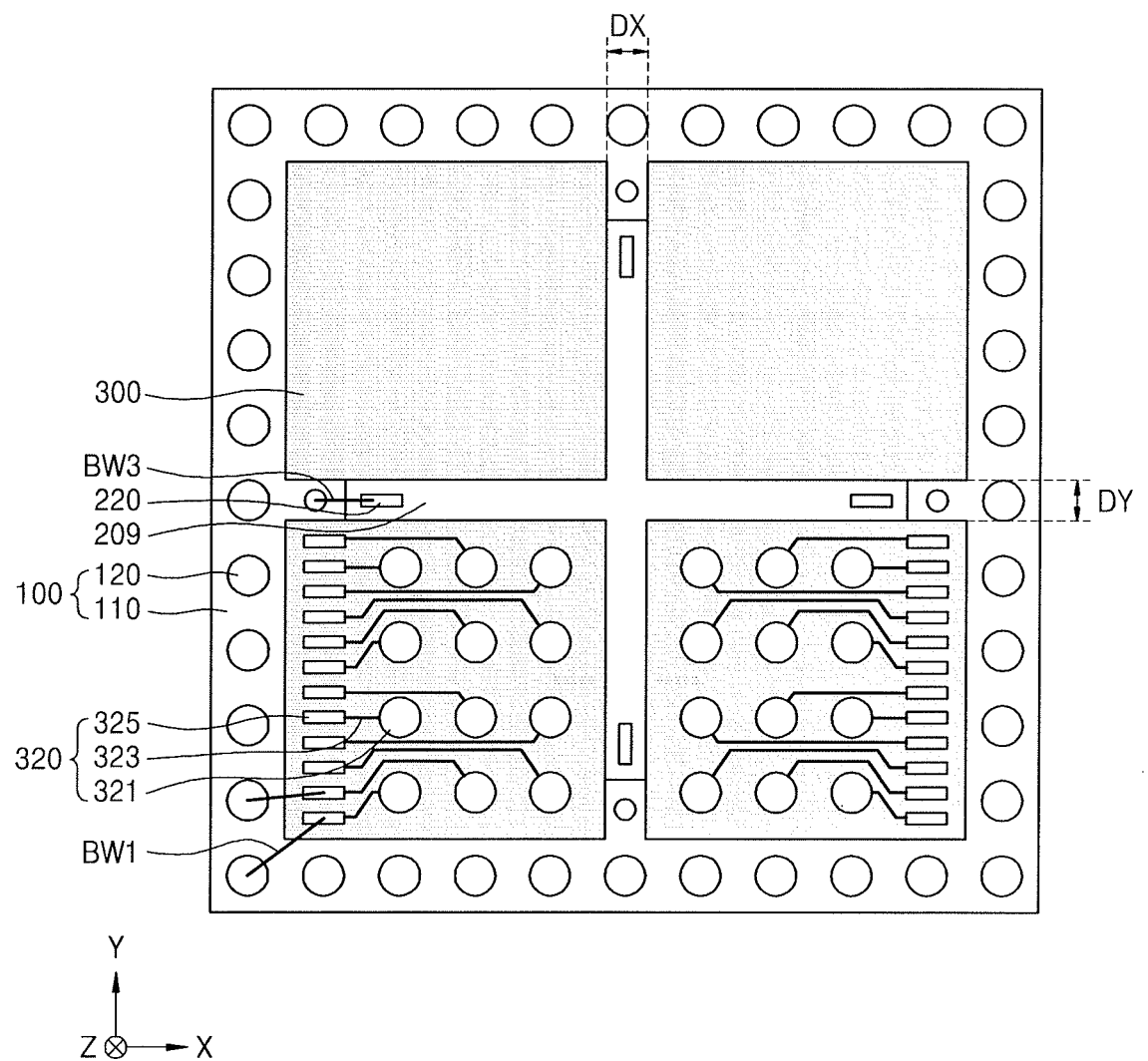

Referring to FIGS. 9A-9B, FIG. 9A is a cross-sectional view of a semiconductor package 90, and FIG. 9B is a plan view of the semiconductor package 90. For convenience of explanation, the molding member MB and the upper semiconductor chip 400 are omitted in FIG. 9B.

As illustrated in FIGS. 9A and 9B, the semiconductor package 90 may include the package substrate 100, the lower semiconductor chip 200, the interposer 300 including a plurality of pieces, and the upper semiconductor chip 400. Further, the semiconductor package 90 may include a lower semiconductor chip 209 electrically connected to the package substrate 100 via a third bonding wire BW3.

In the semiconductor package 90, a second adhesive member DAF2 may be adhered to the lower semiconductor chip 209 and the package substrate 100. The second adhesive member DAF2 may be substantially the same as the first adhesive member DAF1. That is, the second adhesive member DAF2 may include a die attach film.

In the semiconductor package 90, a thickness of the first bonding member DAF1 may be formed to be greater than or equal to a thickness for looping a third bonding wire BW3, in order to prevent mechanical deformation of the third bonding wire BW3. That is, a level of an upper surface of the first bonding member DAF1 may be higher than a level of an uppermost surface of the third bonding wire BW3.

Figure 10:
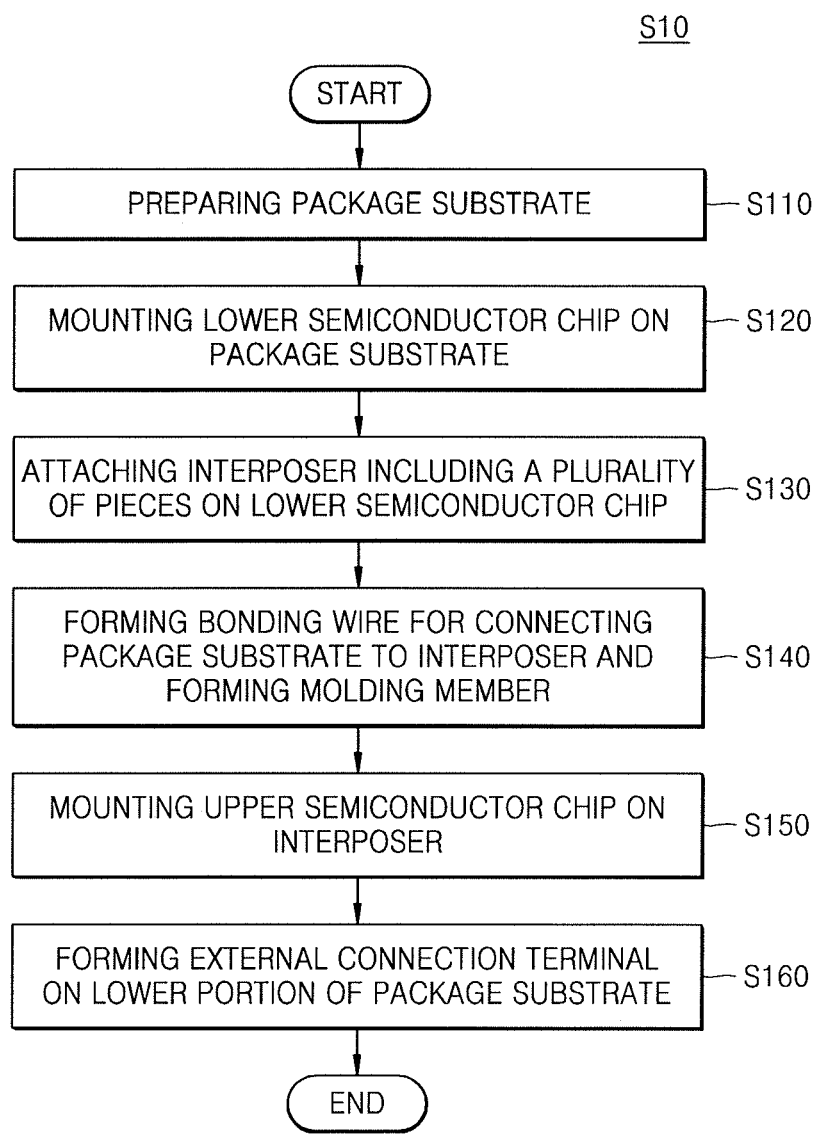
FIG. 10 illustrates a flowchart of a method of manufacturing a semiconductor package, according to an example embodiment.

FIG. 10 is a flowchart illustrating a method of manufacturing a semiconductor package according to an example embodiment of embodiments;

Referring to FIG. 10, a method S10 of manufacturing a semiconductor package may include a first step S110 of preparing a package substrate, a second step S120 of mounting a lower semiconductor chip on the package substrate, a third step S130 of attaching an interposer including a plurality of pieces on the lower semiconductor chip, a fourth step S140 of forming a bonding wire for connecting the package substrate to the interposer and then forming a molding member, a fifth step S150 of mounting an upper semiconductor chip to the interposer, and a sixth step S160 of forming an external connection terminal on a lower portion of the package substrate.

The manufacturing method S10 of the semiconductor package may include the above-described exemplary process steps S110 to S160. If some embodiments may be implemented otherwise, a specific process step may be performed differently from an order of the above-described process steps. For example, two processes that are described in succession may be performed substantially concurrently, or may be performed in the reverse order to the above-described order.

Technical features of the first through sixth steps S110 through S160 will be described in detail with reference to FIGS. 11A through 11E. FIGS. 11A to 11E are cross-sectional views of stages in a method of manufacturing a semiconductor package according to an example embodiment.

Figure 11A:
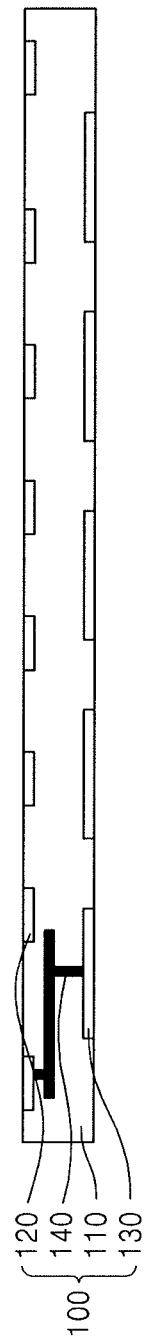
FIGS. 11A to 11E illustrate cross-sectional views of stages in a method of manufacturing a semiconductor package, according to an example embodiment.

Referring to FIG. 11A, the package substrate 100 may be prepared. The package substrate 100 may include the body portion 110 as the support substrate. The package substrate 100 may be a PCB. The wiring 140 may be formed on the package substrate 100, and the wiring 140 may be electrically connected to the upper electrode pad 120 on the upper surface of the package substrate 100 and the lower electrode pad 130 on the lower surface of the package substrate 100.

Figure 11B:
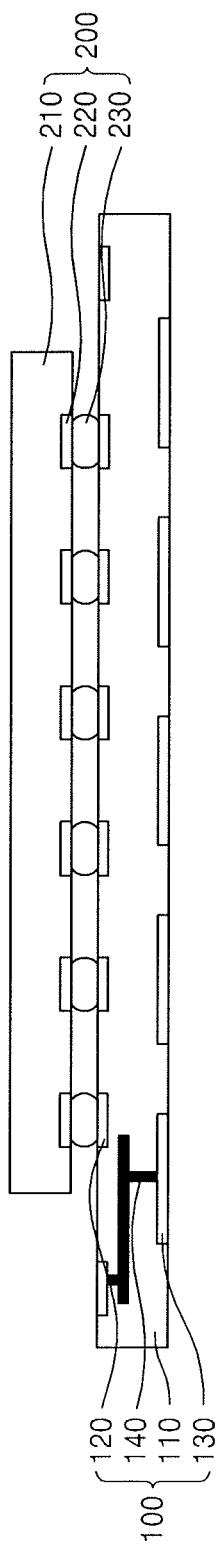

Referring to FIG. 11B, the lower semiconductor chip 200 may be mounted on the package substrate 100.

The semiconductor substrate 210 constituting the lower semiconductor chip 200 may have the active surface and the inactive surface. The active surface of the semiconductor substrate 210 may be disposed to face the upper surface of the package substrate 100. The chip pad 220 may be formed on the active surface of the semiconductor substrate 210.

The chip pad 220 may be directly connected to the upper electrode pad 120 disposed on the upper surface of the package substrate 100 through a connection terminal 230. The chip pad 220 and the upper electrode pad 120 may be used as terminals for signal transmission between the lower semiconductor chip 200 and the package substrate 100.

Figure 11C:
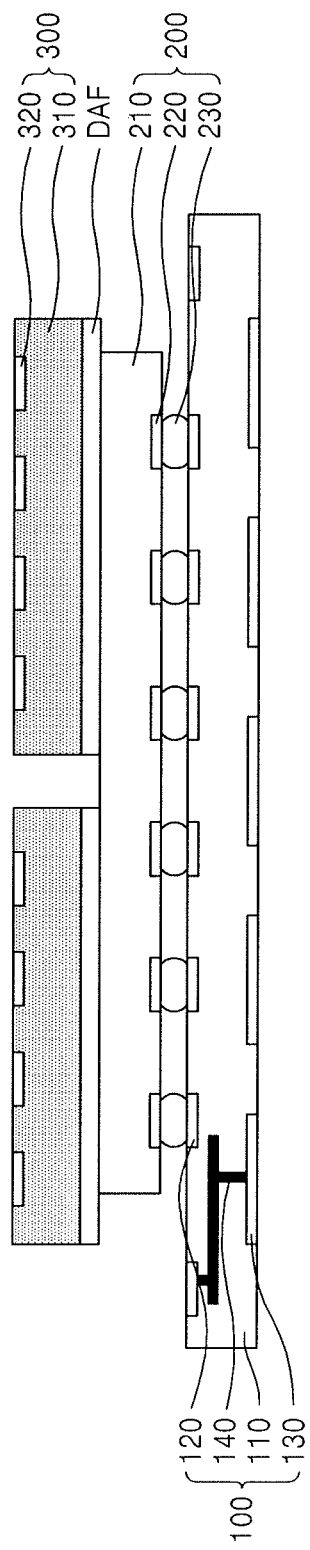

Referring to FIG. 11C, the interposer 300 including a plurality of pieces may be attached on the lower semiconductor chip 200. The interposer 300 may be attached to the upper surface of the lower semiconductor chip 200 using the adhesive member DAF. For example, each piece, i.e., portion, of the interposer 300 may be attached to a different part of the lower semiconductor chip 200 via a separate adhesive member DAF, such that the plurality of pieces of the interposer 300 may be spaced apart from each by a predetermined distance on the lower semiconductor chip 200 to define rows and columns on the lower semiconductor chip 200.

In a plan view, a portion of the interposer 300 may overlap with the lower semiconductor chip 200, e.g., each of plurality of pieces of the interposer 300 may overlap a portion of the lower semiconductor chip 200. In addition, an outermost edge of the interposer 300 may protrude beyond an edge of the lower semiconductor chip 200 along a horizontal direction, e.g., at least some of plurality of pieces of the interposer 300 may extend beyond an edge of the lower semiconductor chip 200 to overhang the edge of the lower semiconductor chip 200.

Figure 11D:
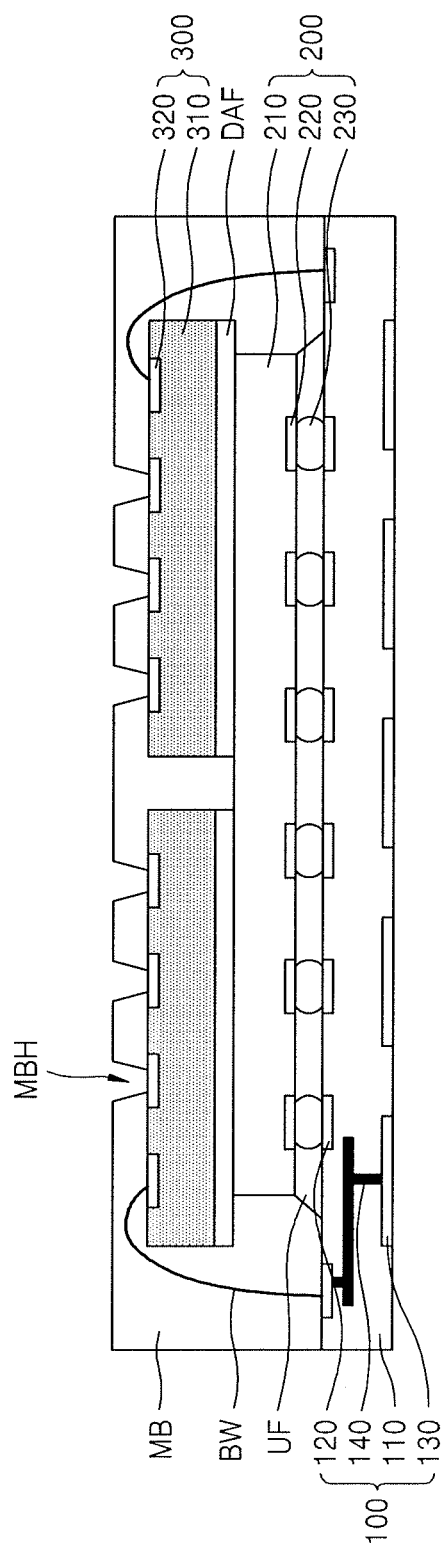

Referring to FIG. 11D, after forming the bonding wire BW for connecting the package substrate 100 and the interposer 300, the molding member MB may be formed so as to cover the lower semiconductor chip 200, the interposer 300, and the bonding wire BW. A portion of the molding member MB may, e.g., completely, fill the spaces between adjacent ones of the plurality of pieces of the interposer 300.

In detail, the bonding wire BW may electrically connect the package substrate 100 to the interposer 300. After the bonding wire BW is formed, an appropriate amount of molding material may be injected onto the package substrate 100, and the molding member MB may be formed through the curing process of the molding material.

A photolithography process and an etching process may be performed to form an opening MBH for opening an upper surface pad of the redistribution layer structure 320 of the interposer 300. The photolithography process and the etching process may be performed according to any convenient processes.

Figure 11E:
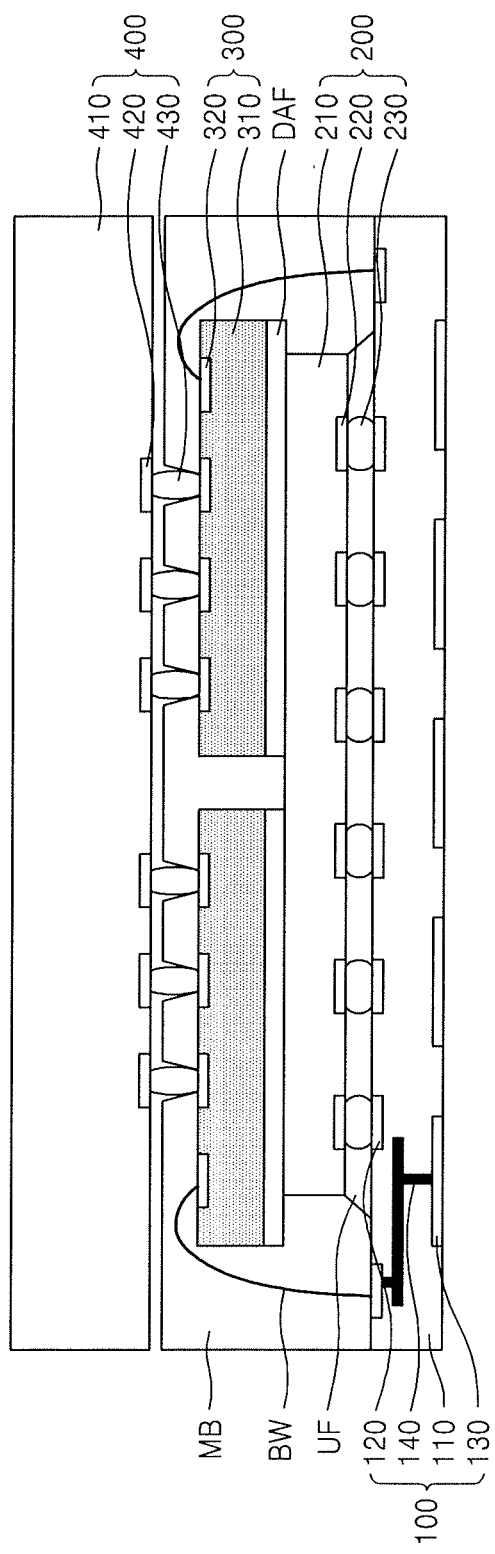

Referring to FIG. 11E, the upper semiconductor chip 400 may be mounted on the interposer 300. The upper semiconductor chip 400 may include the semiconductor substrate stack 410 and the chip pad 420 formed on the lowermost surface of the semiconductor substrate stack 410.

The chip pad 420 may be directly connected to the redistribution layer structure 320 disposed in the upper surface of the interposer 300 through the connection terminal 430. The chip pad 420 and the redistribution layer structure 320 may be used as terminals for signal transmission between the upper semiconductor chip 400 and the interposer 300.

Referring again to FIG. 1A, the semiconductor package 10 according to embodiments may be completed by forming the external connection terminal 150 on the lower portion of the package substrate 100.

Figure 12:
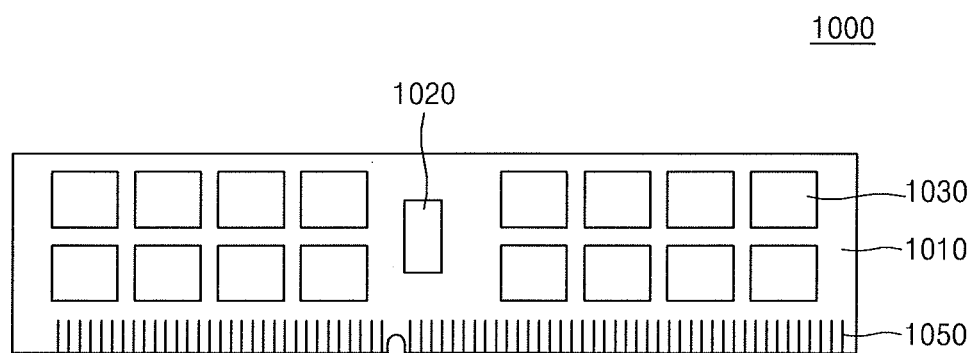
FIG. 12 illustrates a schematic diagram of a semiconductor module including a semiconductor package according to example embodiments.

FIG. 12 is a schematic diagram showing a semiconductor module including a semiconductor package according to example embodiments.

Referring to FIG. 12, a semiconductor module 1000 may include a module substrate 1010, a control chip 1020 mounted on the module substrate 1010, and a plurality of semiconductor packages 1030 mounted on the module substrate 1010. A plurality of input/output terminals 1050, which may be inserted into a socket of a main board, may be disposed on one side of the module substrate 1010. The plurality of semiconductor packages 1030 may include any one of the semiconductor packages 10 to 90 according to embodiments, described with reference to FIGS. 1A to 9B.

Figure 13:
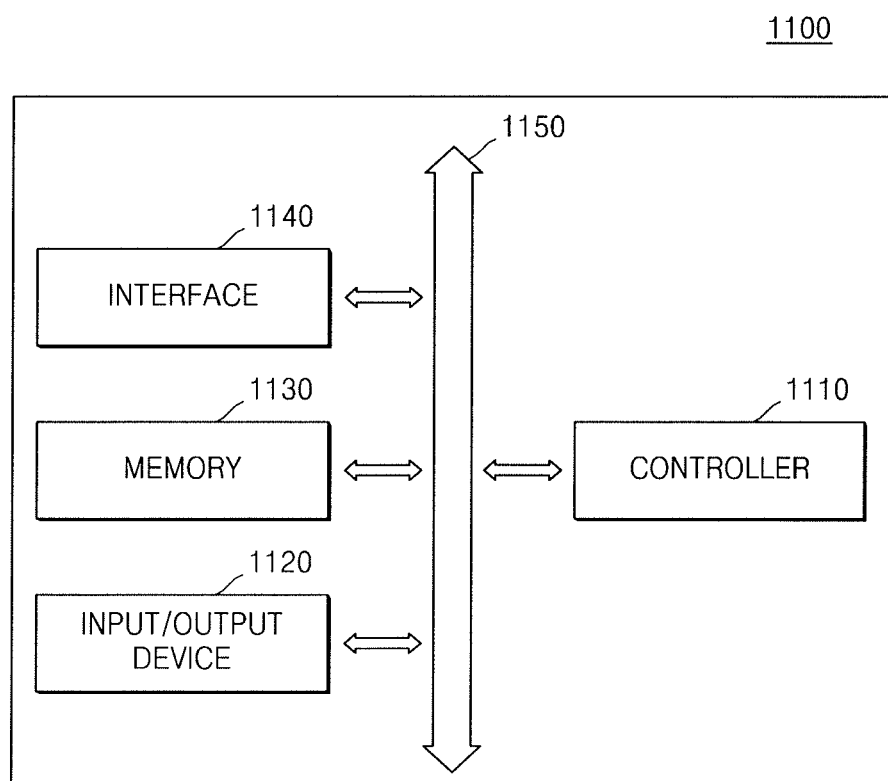
FIG. 13 illustrates a schematic diagram of a system of a semiconductor package according to example embodiments.

FIG. 13 is a schematic diagram illustrating a system of a semiconductor package according to example embodiments.

Referring to FIG. 13, a system 1100 may include a controller 1110, an input/output device 1120, a memory 1130, an interface 1140, and a bus 1150.

The system 1100 may be a mobile system or a system that transmits or receives information. In some embodiments, the mobile system may include, e.g., a portable computer, a web tablet, a mobile phone, a digital music player, or a memory card.

The controller 1110 may be for controlling execution programs in the system 1100 and may include, e.g., a microprocessor, a digital signal processor, a microcontroller, or the like.

The input/output device 1120 may be used to input or output data of the system 1100. The system 1100 may be connected to an external device, e.g., a personal computer or a network, using the input/output device 1120, and may mutually exchange data with the external device. The input/output device 1120 may include, for example, a touch pad, a keyboard, or a display.

The memory 1130 may store data for operation of the controller 1110 or may store data processed by the controller 1110. The memory 1130 may include any one of the semiconductor packages 10 to 90 according to embodiments, described with reference to FIGS. 1A to 9B.

The interface 1140 may be a data transmission path between the system 1100 and the external device. The controller 1110, the input/output device 1120, the memory 1130, and the interface 1140 may communicate with each other via a bus 1150.

By way of summation and review, embodiments provide a semiconductor package in which warpage control is facilitated while semiconductor chips are efficiently arranged in a limited structure of the semiconductor package by using an interposer. That is, according to embodiments, a semiconductor package includes an interposer having a plurality of pieces and a molding member filling a space between the plurality of pieces, in order to alleviate warpage.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
    a package substrate;
    a lower semiconductor chip on the package substrate;
    an interposer on the lower semiconductor chip, the interposer including a plurality of pieces spaced apart from each other;
    an upper semiconductor chip on the interposer; and
    a molding member covering the lower semiconductor chip and the interposer.

2. The semiconductor package as claimed in claim 1, wherein the interposer includes 2N pieces (N is a natural number) arranged in a bilateral symmetrical structure, in a plan view.

3. The semiconductor package as claimed in claim 1, wherein a portion of an upper surface of the lower semiconductor chip does not overlap with the interposer.

4. The semiconductor package as claimed in claim 1, wherein an outermost edge of the interposer extends beyond an edge of the lower semiconductor chip, in a plan view.

5. The semiconductor package as claimed in claim 1, wherein each of the lower semiconductor chip and the interposer includes a substrate including silicon.

6. The semiconductor package as claimed in claim 1, wherein the molding member fills a space between adjacent ones of the plurality of pieces of the interposer, a thermal expansion coefficient of the molding member being greater than a thermal expansion coefficient of the interposer.

7. The semiconductor package as claimed in claim 6, wherein a thermal expansion coefficient of the package substrate is greater than the thermal expansion coefficient of the interposer.

8. The semiconductor package as claimed in claim 1, wherein:
    a portion of an upper surface of the interposer includes a pad region exposed by the molding member,
    the interposer and the upper semiconductor chip are connected to each other through a connection member in the pad region, and
    the upper semiconductor chip is spaced apart from the molding member.

9. The semiconductor package as claimed in claim 8, wherein:
a number of terminal regions in which the connection member is arranged in the upper semiconductor chip is equal to a number of the plurality of pieces of the interposer, and
each of the terminal regions overlaps a corresponding one of the plurality of pieces of the interposer.

10. The semiconductor package as claimed in claim 1, wherein the lower semiconductor chip includes a single logic chip, and the upper semiconductor chip includes a stack of a plurality of memory chips.

11. The semiconductor package as claimed in claim 1, wherein the molding member includes:
a first molding member filling a space between the plurality of pieces of the interposer; and
a second molding member covering the lower semiconductor chip, the interposer, and the first molding member, a thermal expansion coefficient of the first molding member being greater than a thermal expansion coefficient of the second molding member.

12. The semiconductor package as claimed in claim 11, wherein the first molding member includes a metallic material, and an insulating film is disposed between the interposer and the first molding member.

13. The semiconductor package as claimed in claim 1, further comprising:
a first bonding wire connecting the package substrate to the interposer; and
a second bonding wire connecting the pieces of the interposer to each other.

14. The semiconductor package as claimed in claim 1, wherein the interposer is attached to the lower semiconductor chip with an adhesive member.

15. A semiconductor package, comprising:
a package substrate;
a lower semiconductor chip on the package substrate;
an interposer on the lower semiconductor chip, the interposer including a plurality of regions separated from each other via a groove in an upper surface of the interposer;
an upper semiconductor chip on the interposer;
a bonding wire connecting the package substrate to the interposer; and
a molding member covering the lower semiconductor chip, the interposer, and the bonding wire, a thermal expansion coefficient of the molding member being greater than a thermal expansion coefficient of the interposer.

16. The semiconductor package as claimed in claim 15, wherein an edge of the interposer extends beyond an edge of the lower semiconductor chip, in a plan view.

17. The semiconductor package as claimed in claim 15, wherein the molding member includes:
a first molding member filling the groove; and
a second molding member covering the lower semiconductor chip, the interposer, the first molding member, and the bonding wire, a thermal expansion coefficient of the first molding member being greater than a thermal expansion coefficient of the second molding member.

18. The semiconductor package as claimed in claim 15, wherein an end of the groove is spaced apart from an edge of the interposer.

19. The semiconductor package as claimed in claim 15, wherein an end of the groove meets an edge of the interposer.

20. A semiconductor package, comprising:
a package substrate;
a lower semiconductor chip on the package substrate;
an interposer on the lower semiconductor chip, the interposer including a plurality of regions separated from each other by a groove extending from a side surface of the interposer;
an upper semiconductor chip on the interposer;
a bonding wire connecting the package substrate to the interposer; and
a molding member covering the lower semiconductor chip, the interposer, and the bonding wire, a thermal expansion coefficient of the molding member being greater than a thermal expansion coefficient of the interposer.

* * * * *